(12) United States Patent
Kwak et al.

(10) Patent No.: US 11,074,978 B2
(45) Date of Patent: Jul. 27, 2021

(54) MEMORY DEVICE

(71) Applicant: SAMSUNG ELECTRONICS CO., LTD., Suwon-si (KR)

(72) Inventors: Dong Hun Kwak, Hwasung (KR); Sang Wan Nam, Hwasung (KR); Chi Weon Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/891,455

(22) Filed: Jun. 3, 2020

(65) Prior Publication Data

US 2020/0294601 A1 Sep. 17, 2020

Related U.S. Application Data

(63) Continuation of application No. 16/111,539, filed on Aug. 24, 2018, now Pat. No. 10,748,621.

(30) Foreign Application Priority Data

Jan. 8, 2018 (KR) ........................ 10-2018-0002123

(51) Int. Cl.
*G11C 16/10* (2006.01)
*H01L 27/11524* (2017.01)
(Continued)

(52) U.S. Cl.
CPC .......... *G11C 16/10* (2013.01); *G11C 16/0483* (2013.01); *G11C 16/08* (2013.01);
(Continued)

(58) Field of Classification Search
CPC ..... G11C 16/10; G11C 16/3427; G11C 16/08; G11C 16/14; G11C 16/3459; G11C 16/0483; G11C 16/26; G11C 2211/5646; G11C 2211/5641; G11C 11/5671; G11C 11/5628; G11C 16/30; H01L 27/11524; H01L 27/11556; H01L 27/1157; H01L 27/11582
See application file for complete search history.

(56) References Cited

U.S. PATENT DOCUMENTS 7,675,783 B2  3/2010 Park et al.
8,139,406 B2  3/2012 Park et al.
(Continued)

FOREIGN PATENT DOCUMENTS

KR  10-2016-0035443 A  3/2016

*Primary Examiner* — Mohammed A Bashar
(74) *Attorney, Agent, or Firm* — Lee IP Law, PC

(57) ABSTRACT

A memory device includes a memory cell array including a plurality of word lines, at least one select line provided above the plurality of word lines, and a channel region passing through the plurality of word lines and the at least one select line, the plurality of word lines and the channel region providing a plurality of memory cells, and a controller. The controller is to store data in a program memory cell among the plurality of memory cells by sequentially performing a first programming operation and a second programming operation, and to determine a program voltage input to a program word line connected to the program memory cell, in the first programming operation, based on information regarding the program memory cell.

12 Claims, 25 Drawing Sheets

(51) Int. Cl.
  *G11C 16/08* (2006.01)
  *H01L 27/11556* (2017.01)
  *G11C 16/14* (2006.01)
  *G11C 16/34* (2006.01)
  *H01L 27/1157* (2017.01)
  *H01L 27/11582* (2017.01)
  *G11C 16/04* (2006.01)
  *G11C 16/26* (2006.01)
  *G11C 11/56* (2006.01)

(52) U.S. Cl.
  CPC ............. *G11C 16/14* (2013.01); *G11C 16/26* (2013.01); *G11C 16/3427* (2013.01); *G11C 16/3459* (2013.01); *H01L 27/1157* (2013.01); *H01L 27/11524* (2013.01); *H01L 27/11556* (2013.01); *H01L 27/11582* (2013.01); *G11C 11/5628* (2013.01); *G11C 11/5671* (2013.01); *G11C 2211/5641* (2013.01); *G11C 2211/5646* (2013.01)

(56) References Cited

U.S. PATENT DOCUMENTS

| | | | |
|---|---|---|---|
| 8,427,878 | B2 | 4/2013 | Shim et al. |
| 8,982,626 | B2 | 3/2015 | Dong et al. |
| 9,064,580 | B2 | 6/2015 | Senoo et al. |
| 9,214,238 | B2 | 12/2015 | Futatsuyama et al. |
| 9,343,156 | B1 | 5/2016 | Mui et al. |
| 2013/0107629 | A1 | 5/2013 | Shim et al. |
| 2013/0198440 | A1* | 8/2013 | Oh .................. G06F 12/0246 711/103 |
| 2013/0286747 | A1 | 10/2013 | Kwak |
| 2014/0226403 | A1 | 8/2014 | Nam et al. |
| 2015/0187428 | A1* | 7/2015 | Okada ................ G11C 16/10 365/185.03 |

* cited by examiner

US 11,074,978 B2

MEMORY DEVICE

CROSS-REFERENCE TO RELATED APPLICATIONS

This is a continuation application based on pending application Ser. No. 16/111,539, filed Aug. 24, 2018, the entire contents of which is hereby incorporated by reference.

Korean Patent Application No. 10-2018-0002123 filed on Jan. 8, 2018 in the Korean Intellectual Property Office, and entitled: "Memory Device," is incorporated by reference herein in its entirety.

BACKGROUND

1. Field

Embodiments relate to a memory device.

2. Description of the Related Art

As demand for memory devices having a relatively high capacity, while having a small size, increases, research into a memory device having vertically stacked memory cells has been actively undertaken. As the degree of integration of memory devices has increased, the number of vertically stacked memory cells has also increased. Thus, various methods, in which an increase in interference between memory cells may be prevented, have been proposed.

SUMMARY

According to an aspect, a memory device includes a memory cell array including a plurality of word lines, at least one select line provided above the plurality of word lines, and a channel region passing through the plurality of word lines and the at least one select line, the plurality of word lines and the channel region providing a plurality of memory cells, and a controller to store data in a program memory cell among the plurality of memory cells by sequentially performing a first programming operation and a second programming operation, and to determine a program voltage input to a program word line connected to the program memory cell, in the first programming operation, based on information regarding the program memory cell.

According to an aspect, a memory device includes a first memory region including a plurality of first memory cells, a second memory region including a plurality of second memory cells, each of the plurality of second memory cells storing one bit of data, and a controller to store N bits of data in a first program memory cell of the first memory region, and to divide the N bits of data into data for each bit to be stored in N second program memory cells of the second memory region, where N is a natural number. Each of locations of the second program memory cells in the second memory region corresponds to a location of the first program memory cell in the first memory region.

According to an aspect, a memory device includes a memory cell array including a plurality of memory cells stacked on a substrate in a direction perpendicular to an upper surface of the substrate, and a controller to store N bits of data in the plurality of memory cells by sequentially performing a first programming operation and a second programming operation, where N is a natural number. The controller is to input different program voltages to at least portions of the plurality of memory cells in the first programming operation, such that at least the portions of the plurality of memory cells have different threshold voltage distributions.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, example embodiments will be described with reference to the accompanying drawings.

Figure 1:
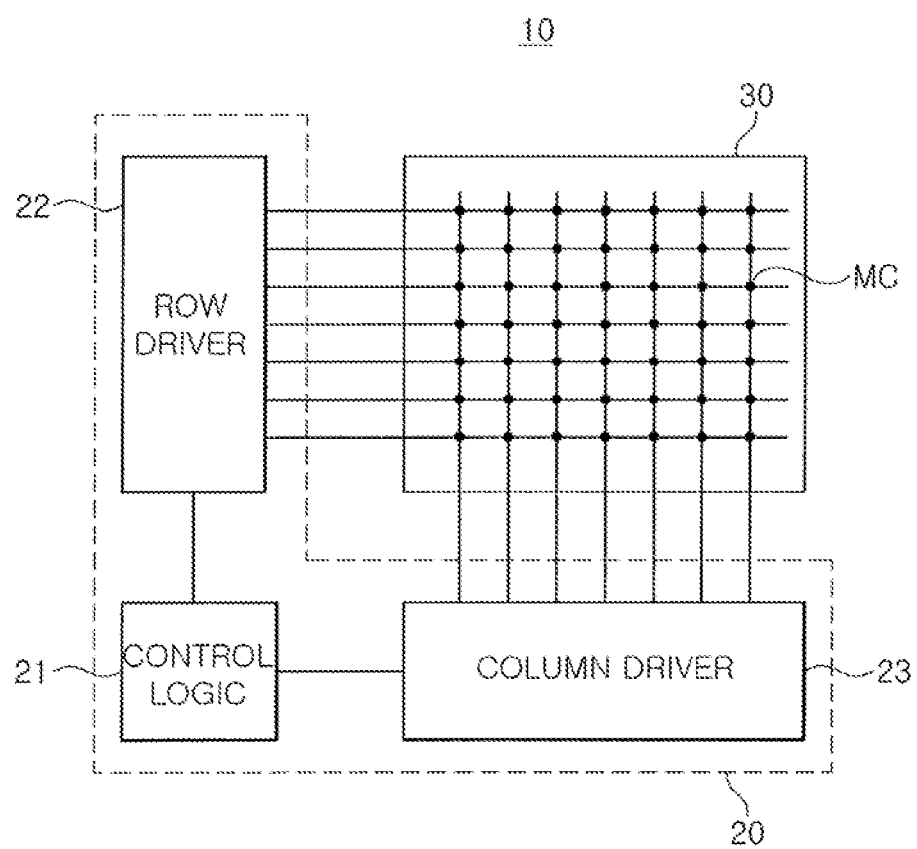
FIG. 1 illustrates a schematic block diagram of a memory device according to an example embodiment.
Figure 2:
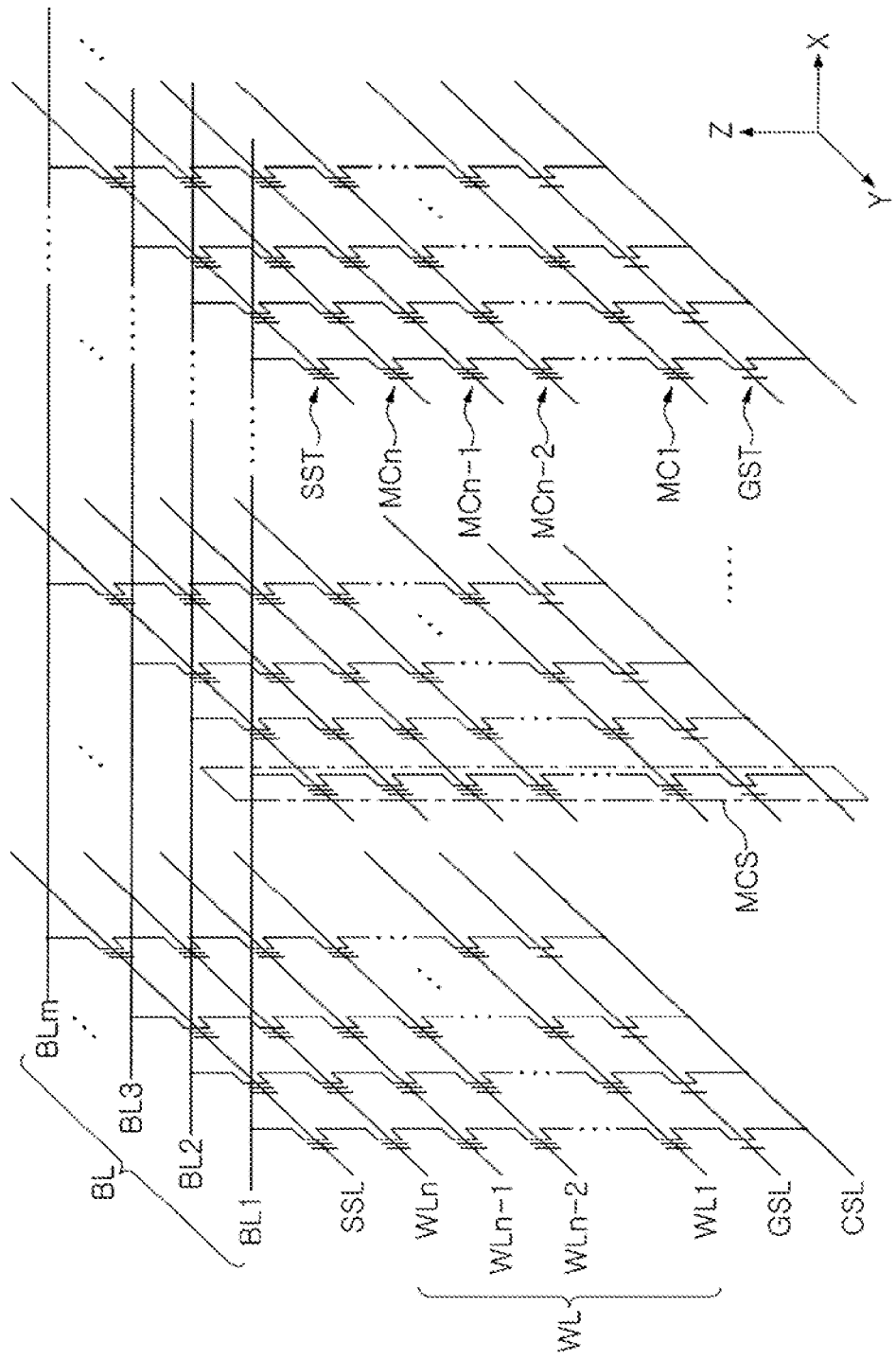
FIG. 2 illustrates a view of a memory cell array included in a memory device according to an example embodiment.

FIG. 1 is a schematic block diagram of a memory device according to an example embodiment. FIG. 2 is a schematic perspective of a memory cell array included in a memory device according to an example embodiment.

Referring to FIG. 1, a memory device 10 according to an example embodiment may include a memory controller 20 and a memory cell array 30. The memory controller 20 may include a control logic 21, a row driver 22, a column driver 23, and the like. The memory cell array 30 may include a plurality of memory cells MC.

In an example embodiment, the row driver 22 may be connected to the memory cells MC through word lines WL, string select lines SSL, common source lines CSL, ground select lines GSL, and the like. The column driver 23 may be connected to the memory cells MC through bit lines BL. In an example embodiment, the row driver 22 may include an address decoder circuit selecting a memory cell MC to write or read data, and the column driver 23 may include a page buffer to write data to the memory cell MC or read data from the memory cell MC. Operations of the row driver 22 and the column driver 23 may be controlled by the control logic 21.

Referring to FIG. 2, the memory cell array 30 according to an example embodiment may include a plurality of memory cells MC. The memory cells MC may be respectively arranged on points at which a plurality of word lines WL and a plurality of bit lines BL intersect each other, e.g., form a matrix. For example, each of the memory cells MC may respectively be connected to a single word line WL and a single bit line BL.

The plurality of memory cells MC may be connected to each other in series, thereby providing a single memory cell string MCS. The memory cell string MCS may further include a string select transistor SST and a ground select transistor GST in addition to the memory cells MC. The string select transistor SST may be connected to one of the bit lines BL above the memory cells MC in the memory cell string MCS. The ground select transistor GST may be connected to the common source line CSL below the memory cells MC.

Although the example embodiment of FIG. 2 illustrates that one memory cell string MCS includes one ground select transistor GST and one string select transistor SST, the number of the ground select transistor GST and the number of the string select transistor SST may be changed. In addition, at least one dummy word line may further be between the ground select transistor GST and the word lines WL and/or between the string select transistor SST and the word lines WL.

Figure 3:
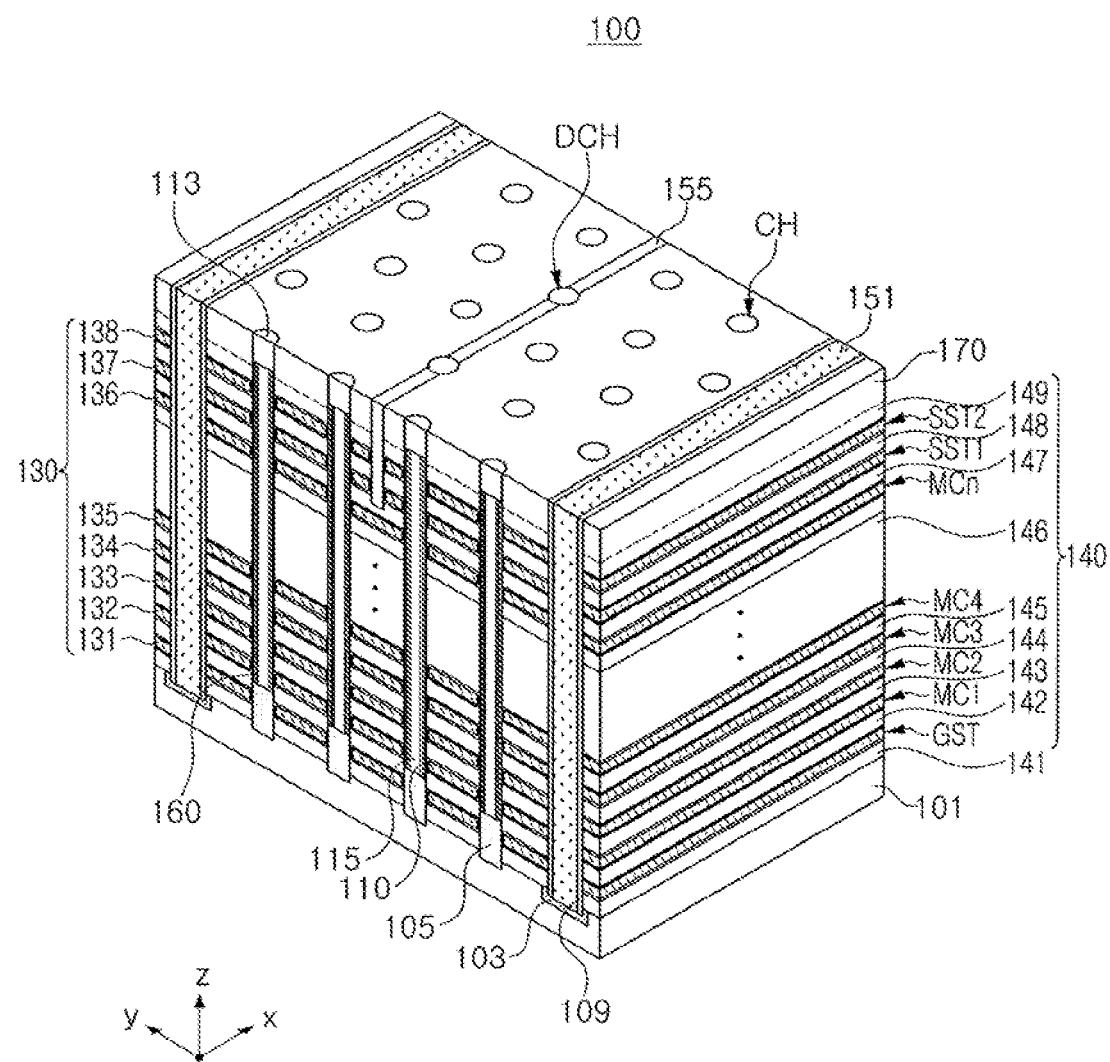
FIG. 3 illustrates a schematic view of a structure of a memory device according to an example embodiment.

FIG. 3 is a schematic view of a structure of a memory device according to an example embodiment. FIG. 3 is a partial perspective view of a memory cell array included in a memory device 100.

With reference to FIG. 3, the memory device 100 according to an example embodiment may include a substrate 101, a plurality of channel structures CH and dummy channel structures DCH, perpendicular, e.g., along a z-axis direction, to an upper surface of the substrate 101, e.g., an x-y plane in the example embodiment of FIG. 3, a plurality of gate electrode layers 131 to 138 (gate electrode layers 130 stacked on the substrate 101, e.g., along the z-axis direction, to be adjacent to the channel structures CH, and the like, and may extend in the x-y plane. The plurality of gate electrode layers 130 may be stacked alternately with a plurality of insulating layers 141 to 149 (insulating layers 140), e.g., along the z-axis direction. A portion of the plurality of gate electrode layers 130 may be divided, e.g., in the x-y plane, into a plurality of portions by an isolation insulating layer 155.

The plurality of gate electrode layers 130 may provide a ground select line 131, string select lines 137 and 138, and a plurality of word lines 132 to 136. Together with the channel structures CH, the ground select line 131 may provide the ground select transistor GST, and the string select lines 137 and 138 may provide a string select transistor SST including two string select transistors SST1 and SST2. Referring to FIG. 3, a first string select transistor SST1 may correspond to a first string select line 138, and a second string select transistor SST2 may correspond to a second string select line 137. Together with the channel structures CH, the plurality of word lines 132 to 136, between the ground select line 131 and the string select lines 137 and 138, may provide a plurality of memory cells MC1 to MCn.

The plurality of gate electrode layers 130 may be divided into a plurality of portions by a common source line 151 and a spacer 109 provided on sidewalls of the common source line 151. The common source line 151 may be formed of an conductive material, e.g., a metal, a metal compound, polysilicon or the like, and may be electrically connected to a source region 103 in the substrate 101. The source region 103 may be provided as a source region of the ground select transistor GST. The common source line 151 may be electrically isolated from the plurality of gate electrode layers 130 by the spacer 109.

The plurality of channel structures CH and dummy channel structures DCH may extend in a direction perpendicular to an upper surface of the substrate 101, e.g., in the z-axis direction in the example embodiment illustrated in FIG. 3. Each channel structure CH may include a channel region 110, an embedded insulating layer 115 filling an internal space of the channel region 110, a drain region 113 arranged on the channel region 110, a gate insulating layer 160 arranged between the channel region 110 and the gate electrode layers 130, and the like. The gate insulating layer 160 may include a tunneling layer, a charge storage layer, a blocking layer and the like, and at least a portion of the gate insulating layer 160 may surround the gate electrode layers 130. The channel region 110 may have a columnar shape, e.g., a cylindrical shape or a prismatic shape, and may not have the embedded insulating layer 115 according to an example embodiment. In addition, the respective channel structures CH may have an inclined side surface, e.g., tapered sidewalls, narrowing toward the substrate 101, according to an aspect ratio.

The plurality of channel structures CH and dummy channel structures DCH may be separated from each other on the x-y plane. The number and the arrangement types of the plurality of channel structures CH and dummy channel structures DCH may be variously changed according to example embodiments. For example, the plurality of channel structures CH and dummy channel structures DCH may be arranged in zig-zag pattern in at least one direction. The example embodiment of FIG. 3 illustrates that the plurality of channel structures CH are symmetrical to each other with the isolation insulating layer 155 therebetween, e.g., only through the first string select line 138, and that the plurality of dummy channel structures DCH penetrate through the isolation insulating layer 155. Alternatively, the isolation insulating layer 155 may extend through the string select lines 137 and 138, and/or the plurality of channel structures CH may be asymmetrical.

The channel region 110 may be electrically connected to the substrate 101 via an epitaxial layer 105 provided therebelow. The channel region 110 may include a semiconductor material, e.g., polysilicon or monocrystalline silicon, and the semiconductor material may be undoped or may be doped with a P-type impurity or an N-type impurity. The epitaxial layer 105 may be a layer grown using a selective epitaxy growth (SEG) process. The epitaxial layer 105 may be recessed into the substrate 101 to a predetermined depth as illustrated in FIG. 3.

The number of the gate electrode layers 130 stacked on the substrate 101 has been increasing to increase the capacity of the memory device 100. As the number of the gate electrode layers 130 has increased, an aspect ratio of the channel region 110 has also increased. Thus, in this case, a deviation in area in a direction perpendicular to an upper surface of the substrate 101 may increase. The deviation in area of the channel region may cause a characteristic difference in the plurality of memory cells MC1 to MCn.

In an example embodiment, a programming method, in which characteristic differences in the memory cells MC1 to MCn occurring due to various factors including an increase in the number of the gate electrode layers 130 may be compensated for, may be provided. In the programming method according to an example embodiment, a first programming operation and a second programming operation may be sequentially performed, and a magnitude of a program voltage used in the first programming operation may be differently determined in consideration of characteristic differences of the memory cells MC1 to MCn.

FIGS. 4A to 5B are views of operations in a programming method of a memory device according to an example embodiment. As an example, although memory cells of a memory device in example embodiments of FIGS. 4A to 5B may respectively be multilevel cells in which 2 bit data may be stored, an example embodiment thereof may also be applied to memory cells in which 3 or more bits of data may be stored.

Figure 4A:
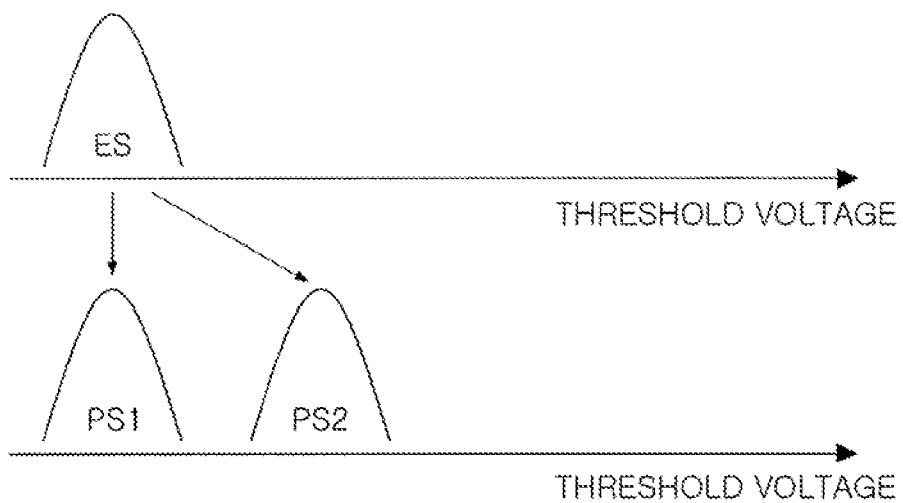
FIGS. 4A to 5B illustrate views of operations in a programming method of a memory device according to an example embodiment.
Figure 4B:
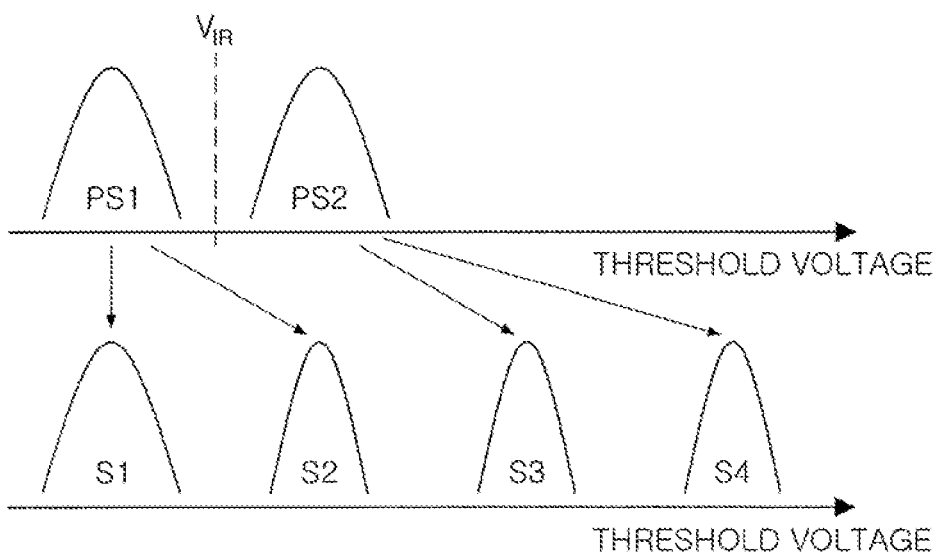

With reference to FIGS. 4A and 4B, in the case of a memory device according to an example embodiment, data may be stored in memory cells by sequentially performing a first programming operation and a second programming operation. In an example embodiment, the first programming operation and the second programming operation may be performed using a programming method, e.g., an incremental step pulse program (ISPP) or the like.

FIG. 4A is a view illustrating the first programming operation. With reference to FIG. 4A, by inputting a program voltage to a memory cell to be programmed, the memory cell in an erase state ES may be moved to one of a first prestate PS1 and a second prestate PS2. In an example embodiment, the first prestate PS1 may be a state such as the erase state ES, and may indicate a threshold voltage distribution of a memory cell in which data is not stored.

For example, when the first programming operation is completed, the memory device may perform the second programming operation, to move the memory cell having the first prestate PS1 to either a first state S1 or a second state S2, or to move the memory cell having the second prestate PS2 to either a third state S3 or a fourth state S4. For example, when each of memory cells may store 2 bits of data therein, each of the first to fourth states S1 to S4 may correspond to data 00, 01, 10, and 11, respectively.

Before performing the second programming operation, the memory device may input an intermediate read voltage $V_{IR}$ to a memory cell, to determine a state of a relevant memory cell to be one of the first prestate PS1 and the second prestate PS2. The intermediate read voltage $V_{IR}$ may be have a value between threshold voltage distributions of the first prestate PS1 and the second prestate PS2, to precisely determine a state of the relevant memory cell.

Figure 5A:
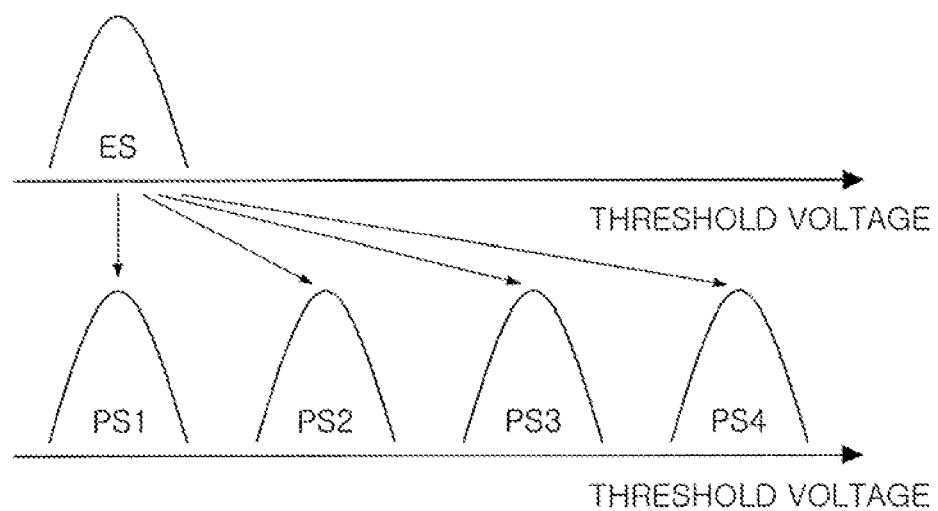
Figure 5B:
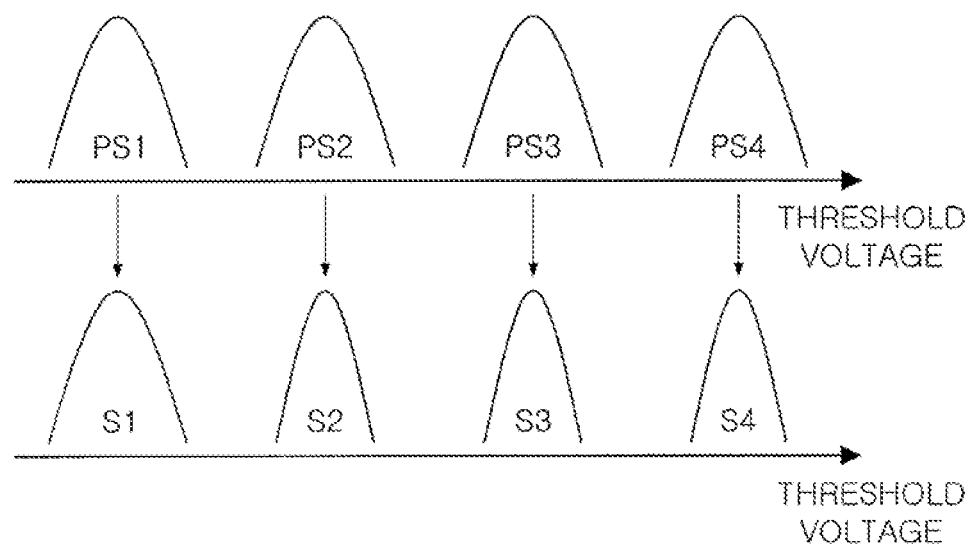

Referring to FIGS. 5A and 5B, in the case of a memory device according to an example embodiment, data may be stored in memory cells by sequentially performing a first programming operation and a second programming operation. FIG. 5A is a view illustrating the first programming operation. With reference to FIG. 5A, by inputting a program voltage to a memory cell to be programmed, the memory cell in an erase state ES may be moved to any one of first to fourth prestates PS1 to PS4. For example, when each of the first to fourth prestates PS1 to PS4 may correspond to data 00, 01, 10, and 11, respectively.

For example, when the first programming operation is completed, the memory device may adjust a threshold voltage distribution of the memory cell having any one of the first to fourth prestates PS1 to PS4, to perform the second programming operation, such that the threshold voltage distribution of the memory cell may have any one of first to fourth states S1 to S4. Referring to FIG. 5B, each of the first to fourth prestates PS1 to PS4 that the memory cells may have by the second programming operation, may be changed into the first to fourth states S1 to S4, respectively. The first to fourth states S1 to S4 may respectively have a relatively narrow distribution, as compared with those of the first to fourth prestates PS1 to PS4. Thus, a margin to accurately read data of the memory cells may be secured to be relatively great.

As described above, as the number of gate electrode layers stacked in the memory device increases and a structure of the memory device becomes complicated, characteristic differences between memory cells may occur. If the same program voltage is input without considering characteristic differences between memory cells, threshold voltage distributions of memory cells may overlap or a margin between threshold voltage distributions may be reduced. Thus, data may not be accurately read.

In an example embodiment, e.g., when a first programming operation on a program memory cell to be programmed is performed, a magnitude of a program voltage input to a program word line that provides the program voltage to the program memory cell may be differ based on information regarding the program memory cell. For example, the information regarding the program memory cell may be a physical location of the program memory cell, and may include a location of the program word line, a location of a channel region providing the program memory cell, a location of a string select line sharing a channel region with the program memory cell, and the like.

Figure 6:
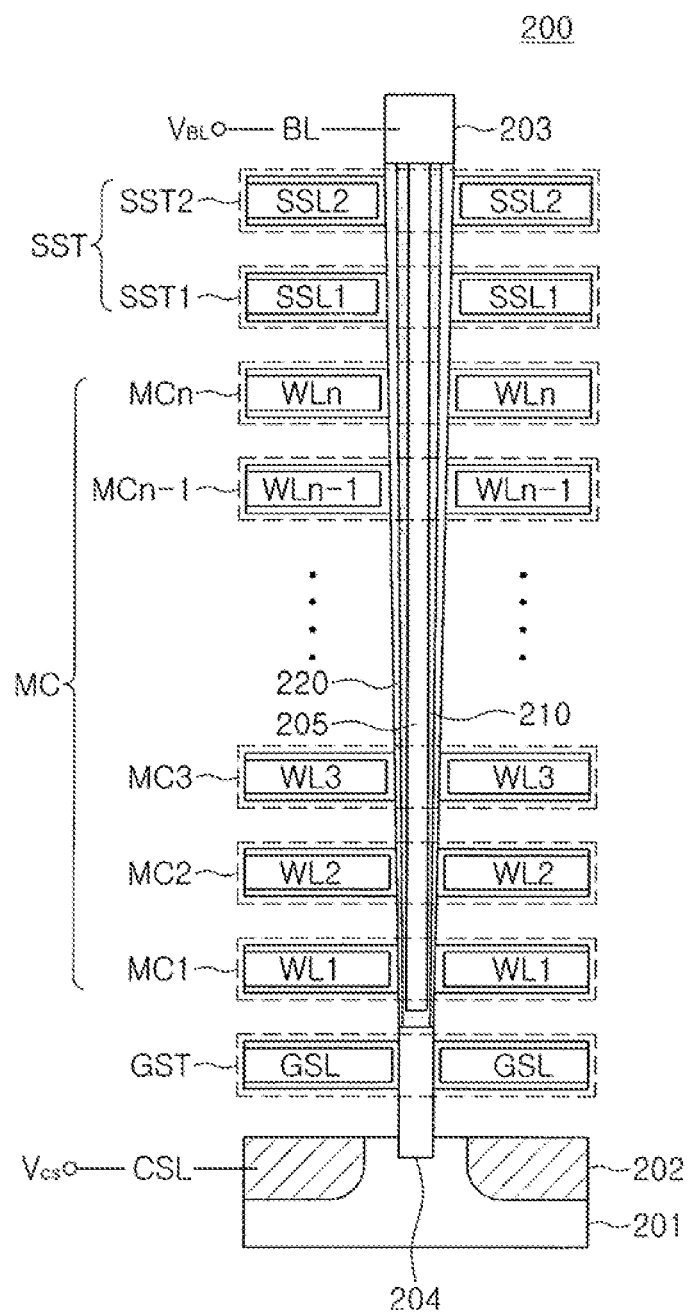
FIGS. 6 to 8 illustrate views of a memory device according to an example embodiment.
Figure 7:
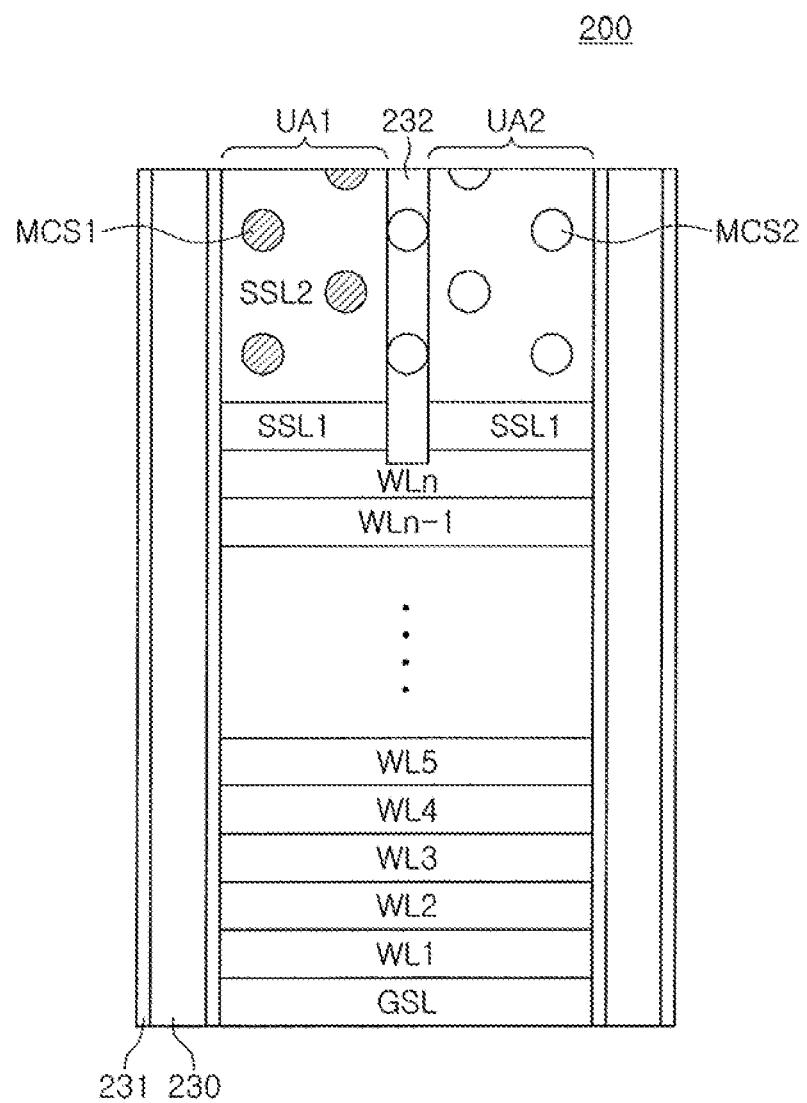
Figure 8:
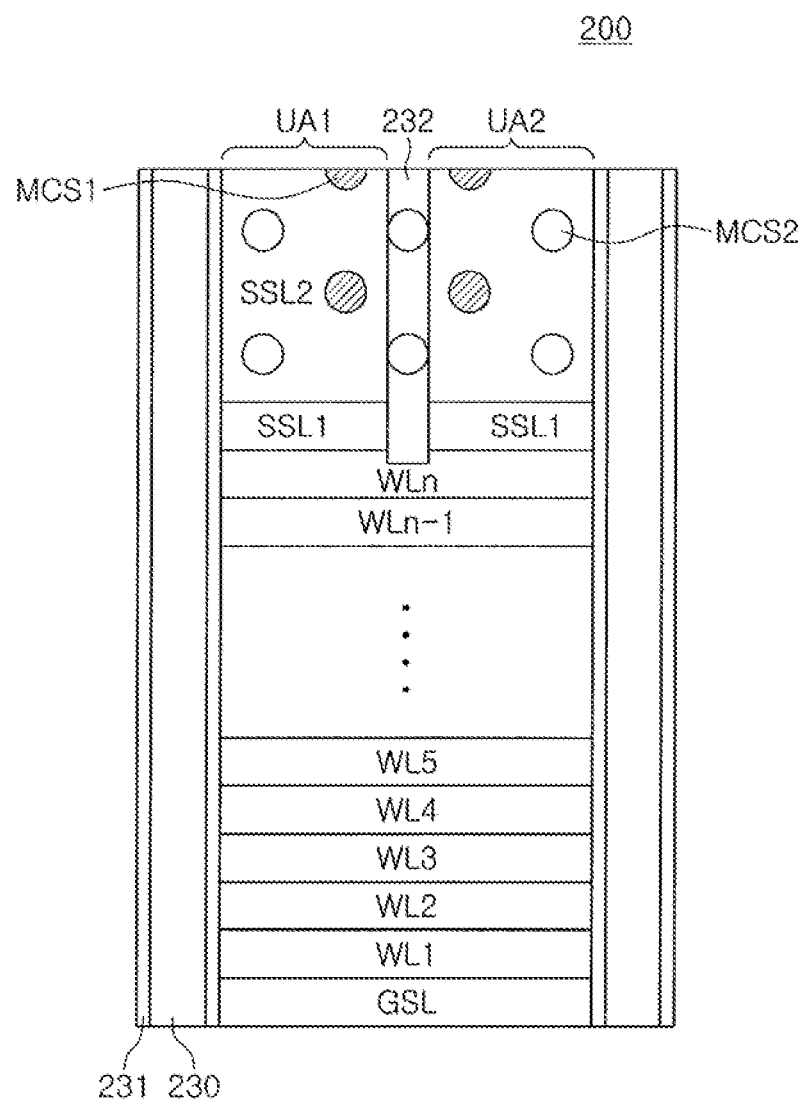

FIGS. 6 to 8 are views illustrating a memory device according to an example embodiment. In an example embodiment, a memory device 200 described with reference to FIGS. 6 to 8 may include a channel region 210 extending in a direction perpendicular, e.g., a z-axis direction, to an upper surface of a substrate 201. The channel region 210 may have a cylindrical shape with an empty central portion, and an internal space of the channel region 210 may be filled with an embedded insulating layer 205.

Referring to FIGS. 6 to 8, a memory device according to an example embodiment may include a plurality of word lines WL1 to WLn stacked on one another, e.g., along the z-axis direction, and adjacent to a channel region 210, string select lines SSL1 and SSL2 adjacent the word line WLn, and a ground select line GSL adjacent the word line WL1, and the like. In an example embodiment, the ground select line GSL may be adjacent to an epitaxial layer 204, instead of the channel region 210. Thus, a ground select transistor GST may have a different structure from those of string select transistors SST1 and SST2 (string select transistor SST) and memory cells MC1 to MCn (memory cells MC).

The memory cells MC may be connected to each other in series between the string select transistor SST and the ground select transistor GST. In the example embodiment illustrated in FIGS. 6 to 8, n memory cells MC are illustrated as being connected to each other between the string select transistor SST and the ground select transistor GST, and the number of memory cells MC may be variously modified.

A drain region 203 may be formed of a conductive material and may be on the channel region 210, adjacent the string select transistor SST, and a source region 202 doped with an impurity may be formed in the substrate 201. The drain region 203 and the source region 202 may be connected to a bit line BL and a common source line CSL, respectively. A gate insulating layer 220 including a charge storage layer may be provided between the channel region 210 and the plurality of word lines WL1 to WLn.

For example, as illustrated in FIG. 6, the memory cells MC may have the gate insulating layer 220 of which a thickness is reduced toward the substrate 201. In particular, as shown in FIG. 6, the thickness of the embedded insulating layer 205 may be constant along the z-axis direction, a thickness of the channel region 210 and the gate insulating layer 220 may have a gradually decreasing thickness along the z-axis direction away from the drain region 203 towards the epitaxial layer 204.

As described above with reference to FIGS. 4A to 5B, the programming operation according to an example embodiment may include a first programming operation and a second programming operation, sequentially performed. For example, a first program voltage may be input to a program memory cell to be programmed, while the first programming operation is performed, and a second program voltage may be input to the program memory cell to be programmed, while the second programming operation is performed. The first program voltage and the second program voltage may have different values.

In an example embodiment, a value of the first program voltage may be determined differently based on information regarding the program memory cell. The information regarding the program memory cell may be information indicating a threshold voltage distribution that varies depending on a location of the program memory cell, e.g., a physical location of the program memory cell. In addition, the physical location of the program memory cell may include a location of the program word line providing the program memory cell, a location of the channel region providing the program memory cell together with the program word line, a location of a string select line sharing the channel region together with the program word line, and the like.

Referring to FIG. 6, in an example embodiment, the first program voltage may be adjusted depending on a location of the program word line supplying the program voltage to the program memory cell, e.g., depending on how close the program word line is to the substrate 201. Thicknesses of the gate insulating layer 220 and the charge storage layer included in the program memory cell may vary depending on a distance between the program word line and the substrate 201, and the first program voltage can be adjusted in consideration of the thicknesses of the gate insulating layer 220.

Referring to FIG. 7, the first program voltage may be adjusted depending on whether the program memory cell is included in a first memory cell string MCS1 or a second memory cell string MCS2. That is, the first program voltage may be determined in consideration of locations of the string select lines SSL1 and SSL2 sharing the channel region together with the program memory cell. Thus, first program voltage input to memory cells MC included in a first region unit UA1 may be different than that input to memory cells MC included in a second region unit. The first region unit UA1 and the second region unit UA2 may be defined by an isolation insulating layer 232.

Referring to FIG. 8, the first memory cell string MCS1 and the second memory cell string MCS2 may also be defined by distances thereof from a vertical spacer 231 or a common source line 230 connected to the source region 202 while dividing a plurality of word lines WL1 to WLn into a plurality of regions. In the memory device, the first program voltage may be adjusted depending on in which of the first memory cell string MCS1 and the second memory cell string MCS2 includes the program memory cell.

FIGS. 9A, 9B, 10A and 10B are diagrams illustrating threshold voltage distributions of memory cells included in a memory device according to an example embodiment.

Figure 9A:
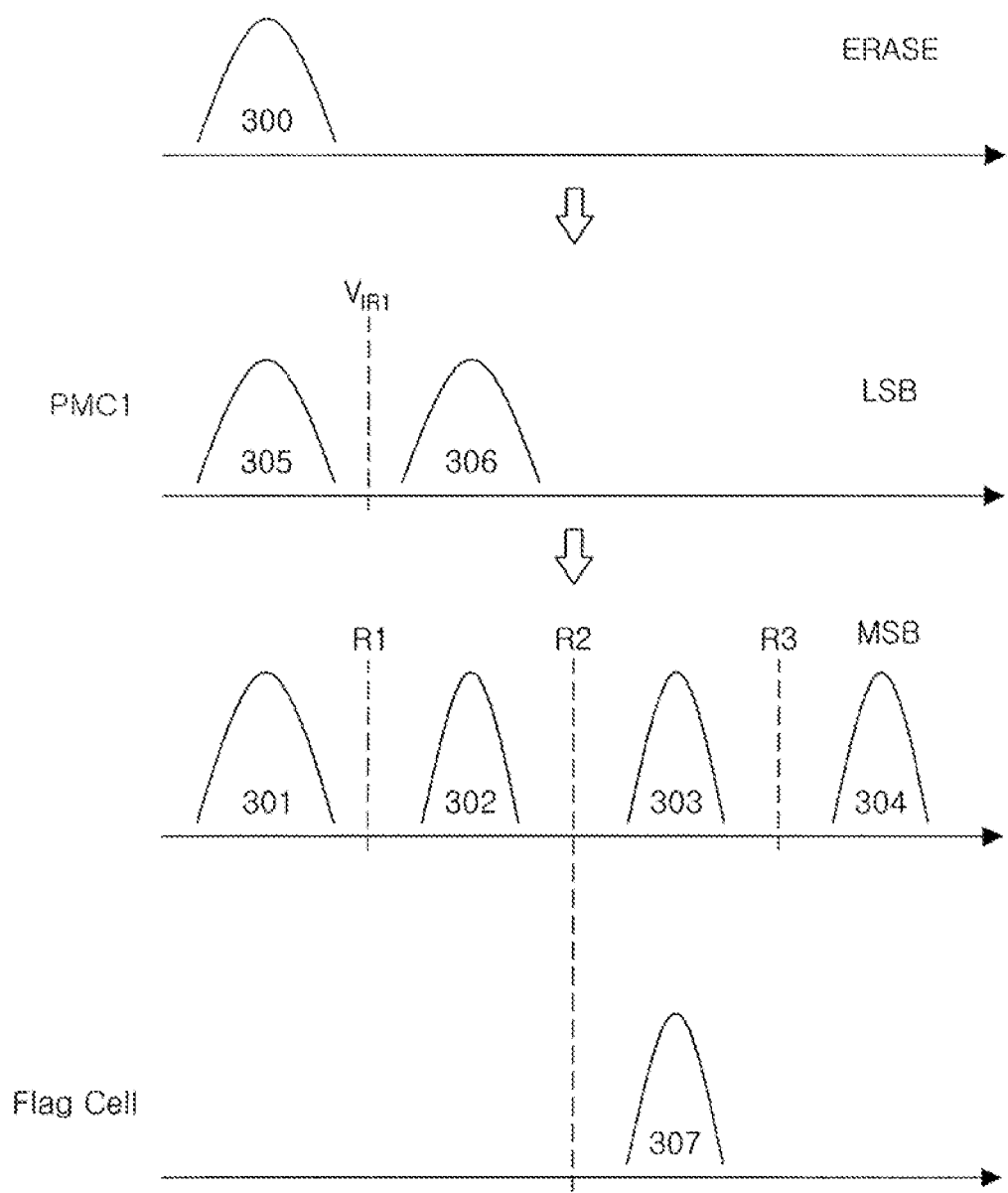
FIGS. 9A, 9B, 10A and 10B illustrate diagrams of threshold voltage distributions of memory cells included in a memory device according to an example embodiment.
Figure 9B:
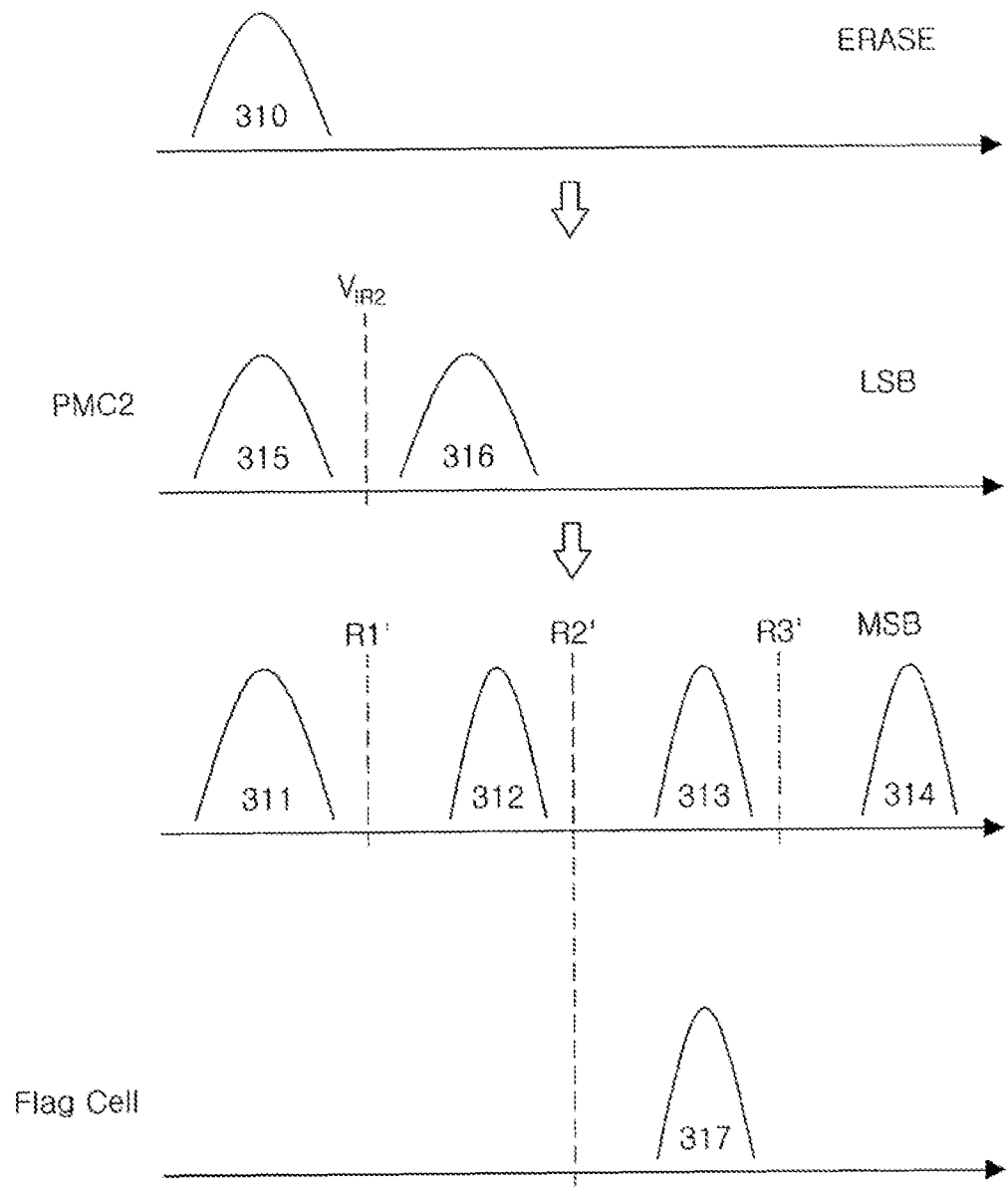

First, in the case of a programming method according to an example embodiment illustrated in FIGS. 9A and 9B, in a multi-level cell (MLC) mode in which two or more bits of data are stored in a single memory cell, lower bits may be stored in a memory cell by a first programming operation, and upper bits may be stored in a memory cell by a second programming operation. Thus, the programming method may be a shadow programming method. FIGS. 9A and 9B are diagrams illustrating a programming method for respective program memory cells located in different positions in the memory device.

First, referring to FIG. 9A, the first programming operation may be executed by inputting a first program voltage to a first program memory cell PMC1 in an erase state 300. A threshold voltage of the first program memory cell PMC1 may be changed to either a first prestate 305 or a second prestate 306 by the first programming operation. For example, the first prestate 305 may be the same as the erase state 300.

The memory device may discriminate between the lower bits written to the first program memory cell PMC1 by the first programming operation, by inputting a first intermediate read voltage $V_{IR1}$ to the first program memory cell PMC1. The memory device may perform a second programming operation of inputting a second program voltage to the first program memory cell PMC1. By the second programming operation, the state of the first program memory cell PMC1 may be changed from the first prestate 305 to a first state 301 or a second state 302, or the state of the first program memory cell PMC1 may be changed from the second prestate 306 to a third state 303 or a fourth state 304.

For example, when the second programming operation is completed, the memory device may input one of first to third read voltages R1 to R3 to the first program memory cell PMC1, to verify success or failure of the program, or to read data from the first program memory cell PMC1. The first to fourth states 301 to 304 may correspond to data 00, 01, 10, and 11, respectively.

On the other hand, the memory device according to an example embodiment may include a flag cell indicating the number of bits of data written to the first program memory cell PMC1. For example, the flag cell may be a memory cell operating in a single-level cell (SLC) mode. The memory device may determine the number of bits of data stored in the first program memory cell PMC1, by inputting, the second read voltage R2 among the first to third read voltages R1 to R3, to the flag cell. For example, when two bits are written in the first program memory cell PMC1, the flag cell may have state 307.

Next, referring to FIG. 9B, the first programming operation may be executed by inputting a first program voltage to a second program memory cell PMC2 in an erase state 310. The second program memory cell PMC2 may be in a location different from that of a first program memory cell PMC1 and may have a threshold voltage distribution different from that of the first program memory cell. Thus, the first program voltage input to the second program memory cell PMC2 may be different from the first program voltage input to the first program memory cell PMC1.

In an example described with reference to the example embodiment of FIG. 6, the first program memory cell PMC1 may be a memory cell located to be adjacent to the drain region 203, and the second program memory cell PMC2 may be a memory cell located to be adjacent to the substrate

201. Alternatively, the first program memory cell PMC1 may be a memory cell located to be adjacent to the substrate 201, and the second program memory cell PMC2 may be a memory cell located to be adjacent to the drain region 203. Referring to the example embodiments illustrated in FIGS. 7 and 8 by way of examples, one of the first program memory cell PMC1 and the second program memory cell PMC2 may be included in a first memory cell string MCS1, and the remaining one may be included in a second memory cell string MCS2.

A threshold voltage of the second program memory cell PMC2 may be changed to either a first prestate 315 or a second prestate 316 by the first programming operation. As an example, the first prestate 315 may be the same as the erase state 310. The memory device may discriminate the lower bits written to the second program memory cell PMC2, by inputting a second intermediate read voltage $V_{IR2}$ to the second program memory cell PMC2. The memory device may perform the second programming operation of inputting the second program voltage to the second program memory cell PMC2. By the second programming operation, the state of the second program memory cell PMC2 may be changed from the first prestate 315 to the first state 311 or the second state 312, or the state of the second program memory cell PMC2 may be changed from the second prestate 316 to the third state 313 or the fourth state 314.

Since the first program voltages input to the first program memory cell PMC1 and the second program memory cell PMC2 are different from each other, the prestates 305 and 315 and the second prestates 306 and 316 of each of the first program memory cell PMC1 and the second program memory cell PMC2 may be different from each other. Thus, the second intermediate read voltage $V_{IR2}$ may also be different from the first intermediate read voltage $V_{IR1}$, and the first to fourth states 311 to 314 of the second program memory cell PMC2 may be different from the first to fourth states 301 to 304 of the first program memory cell PMC1.

As a result, first to third read voltages R1' to R3', used for verification of a program or a reading operation of the second program memory cell PMC2, may also be different from the first to third read voltages R1 to R3 of the first program memory cell PMC1. In addition, the second read voltage R2' to read data of the flag cell of the second program memory cell PMC2 may also be set to a value different from that of the first program memory cell PMC1. For example, when two bits are written in the second program memory cell PMC2, the flag cell may have state 317.

Figure 10A:
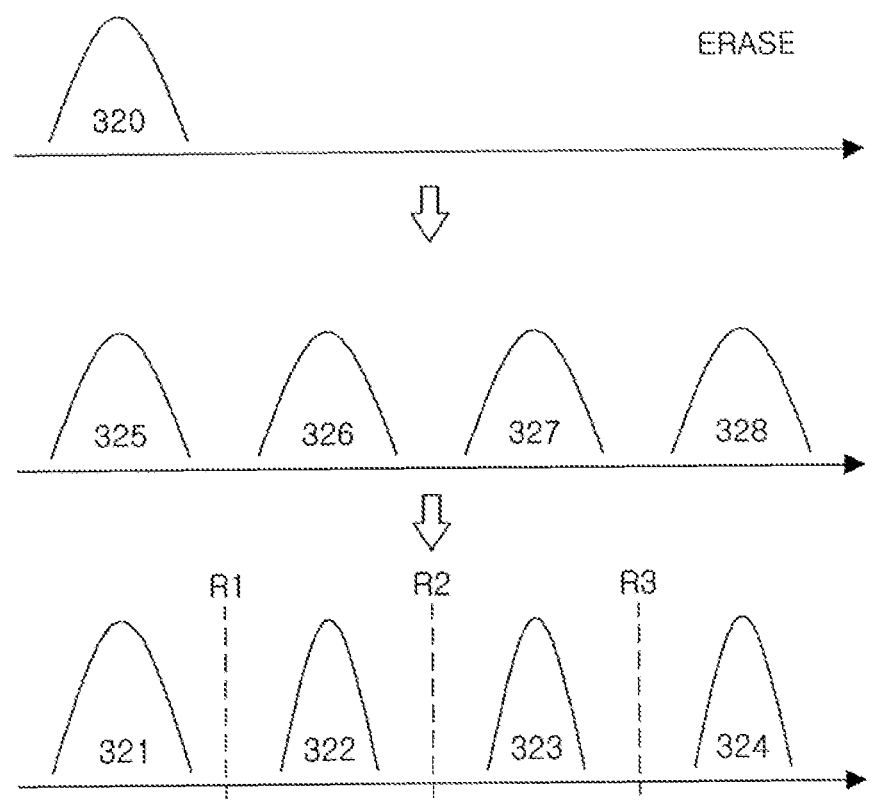
Figure 10B:
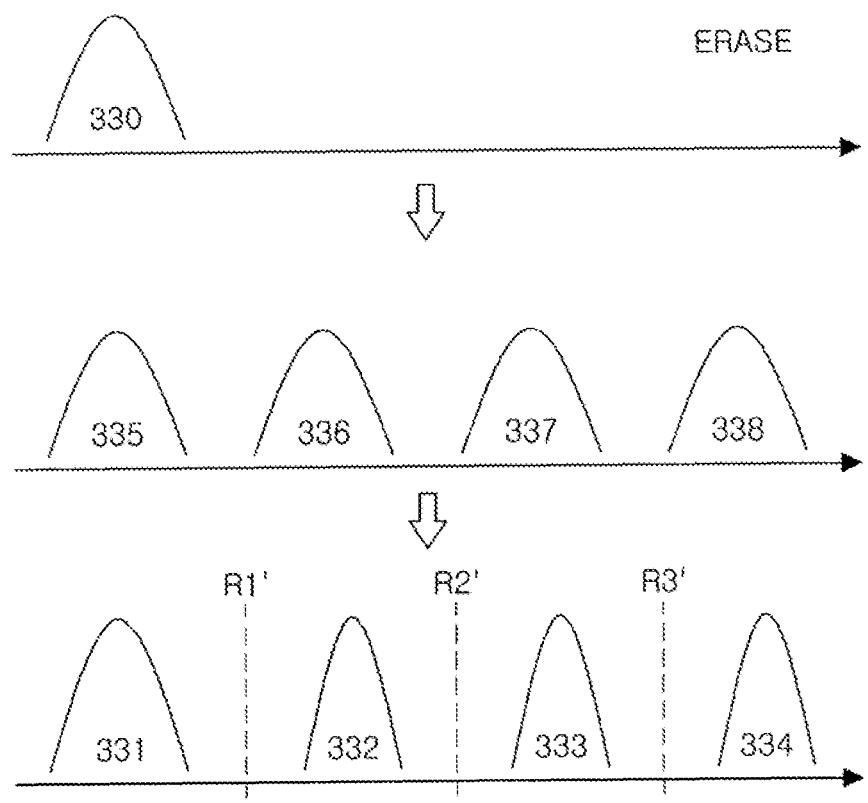

Then, in the case of a programming method according to an example embodiment illustrated in FIGS. 10A and 10B, in an MLC mode in which two or more bits of data are stored in a single memory cell, two or more bits of data may be stored in a memory cell by sequentially performing a first programming operation and a second programming operation. In a manner different from the example embodiment of FIGS. 9A and 9B, the same number of bits of data may be stored in the memory cell by the first programming operation and the second programming operation. Thus, the programming method may be a reprogramming method. FIGS. 10A and 10B are diagrams illustrating a programming method for respective program memory cells located in different positions in the memory device.

Referring to FIG. 10A, a first programming operation may be executed by inputting a first program voltage to a first program memory cell PMC1 provided in an erase state 320. A threshold voltage of the first program memory cell PMC1 may be changed to any one of first to fourth prestates 325 to 328 by the first programming operation. As an example, the first prestate 325 may be the same as the erase state 320.

After the first programming operation, the memory device may perform the second programming operation of inputting a second program voltage to the first program memory cell PMC1. By the second programming operation, a state of the first program memory cell PMC1 may be changed to any one of first to fourth states 321 to 324. The first to fourth states 321 to 324 may have a relatively narrow threshold voltage distribution, as compared with the first to fourth prestates 325 to 328, respectively. Thus, a relatively great margin may be secured in the threshold voltage distribution of the first program memory cell PMC1 by the second programming operation.

For example, when the second programming operation is completed, the memory device may input one of first to third read voltages R1 to R3 to the first program memory cell PMC1, to verify success or failure of the program, or to read data from the first program memory cell PMC1. The first to fourth states 321 to 324 may correspond to data 00, 01, 10, and 11, respectively.

Next, referring to FIG. 10B, the first programming operation may be executed by inputting a first program voltage to a second program memory cell PMC2 in an erase state 330. The second program memory cell PMC2 may be a memory cell having a threshold voltage distribution different from that of the first program memory cell PMC1. In an example embodiment, the first program voltage input to the second program memory cell PMC2 may be different from a first program voltage input to the first program memory cell PMC1.

Describing an example, referring to the example embodiment illustrated in FIG. 6, either the first program memory cell PMC1 or the second program memory cell PMC2 may be a memory cell arranged to be adjacent to the drain region 203, and the remaining one may be a memory cell arranged to be adjacent to the substrate 201. Referring to the example embodiments illustrated in FIGS. 7 and 8 by way of examples, one of the first program memory cell PMC1 and the second program memory cell PMC2 may be included in a first memory cell string MCS1, and the remaining one may be included in a second memory cell string MCS2.

A threshold voltage of the second program memory cell PMC2 may be changed to any one of first to fourth prestates 335 to 338 by the first programming operation. As an example, the first prestate 335 may be the same as the erase state 330. The memory device may perform the second programming operation of inputting a second program voltage to the second program memory cell PMC2. By the second programming operation, a state of the second program memory cell PMC2 may be changed to any one of first to fourth states 331 to 334. The first to fourth states 331 to 334 may have a relatively narrow threshold voltage distribution, as compared with the first to fourth prestates 335 to 338, respectively, similarly to the case of the first program memory cell PMC1. Thus, a relatively great margin may be secured in the threshold voltage distribution of the first program memory cell PMC1 by the second programming operation.

Since the first program voltage input to the first program memory cell PMC1 and the first program voltage input to the second program memory cell PMC2 are different from each other, the prestates 325 to 328 and the prestates 335 to 338 of the first program memory cell PMC1 and the second program memory cell PMC2 may be different from each other, respectively. Thus, the first to fourth states 331 to 334 of the second program memory cell PMC2 may be different from the first to fourth states 321 to 324 of the first program memory cell PMC1, after the second programming operation is completed.

As a result, first to third read voltages R1' to R3', used for verification of a program or a reading operation of the second program memory cell PMC2, may also be different from the first to third read voltages R1 to R3 used for the first program memory cell PMC1. For example, in an example embodiment, first program voltages, different from each other, may be used in consideration of threshold voltage characteristics of the respective program memory cells PMC1 and PMC2. Thus, read voltages used for program verification or a reading operation with respect to the respective program memory cells PMC1 and PMC2 may also be determined to be different from each other.

Figure 11:
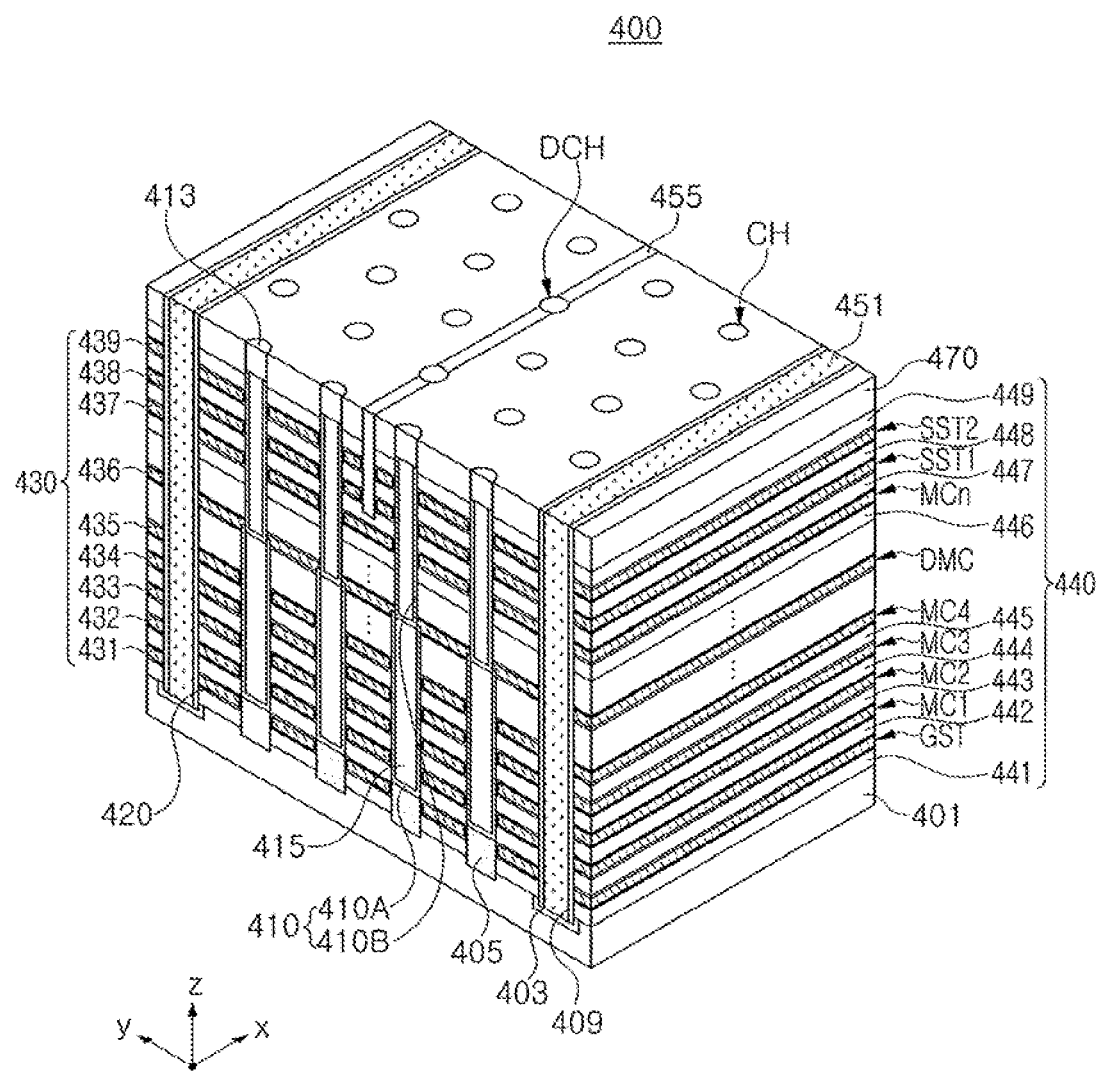
FIG. 11 illustrates a schematic view of a structure of a memory device according to an example embodiment.

FIG. 11 is a schematic view of a structure of a memory device according to an example embodiment. FIG. 11 is a partial perspective view of a memory cell array included in a memory device 400.

Referring to FIG. 11, the memory device 400 according to an example embodiment may include a substrate 401, a plurality of channel structures CH and of dummy channel structures DCH, perpendicular, e.g., along the z-axis direction, to an upper surface of the substrate 401, e.g., an x-y plane of the example embodiment illustrated in FIG. 11, a plurality of gate electrode layers 431 to 439 (gate electrode layers 430) stacked on the substrate 401 to be adjacent to the channel structures CH, and the like. The plurality of gate electrode layers 430 may be stacked alternately, e.g., along the z-axis direction, with a plurality of insulating layers 441 to 449 (insulating layers 440), and at least portions 438 and 439 of the gate electrode layers may be divided into a plurality of portions by an isolation insulating layer 455.

In the example embodiment illustrated in FIG. 11, a channel region 410 may include a lower channel region 410A and an upper channel region 410B. The lower channel region 410A may be connected to the upper channel region 410B. A gate electrode layer 436, adjacent to a boundary between the lower channel region 410A and the upper channel region 410B, may provide a dummy memory cell DMC. In the dummy memory cell DMC, a programming operation may not be performed, in contrast to the other memory cells MC1 to MCn. As the channel region 410 is divided into the lower channel region 410A and the upper channel region 410B, a process problem due to an increase in the number of stages of the memory device 400 may be reduced or prevented.

Other components, except for the channel region 410 and the dummy memory cell DMC, may be similar to those of the memory device 100 illustrated in FIG. 3. The gate electrode layers 430 may be divided into a plurality of regions by a common source line 451 and a spacer 409, and the common source line 451 may be connected to a source region 403 formed in the substrate 401. A gate insulating layer 420 may be formed between the channel region 410 and the gate electrode layers 430. The gate insulating layer 420 may include a plurality of layers, a portion of which may also be dividedly formed on an external side of the channel region 410 and on respective external sides of the gate electrode layers 430.

Figure 12:
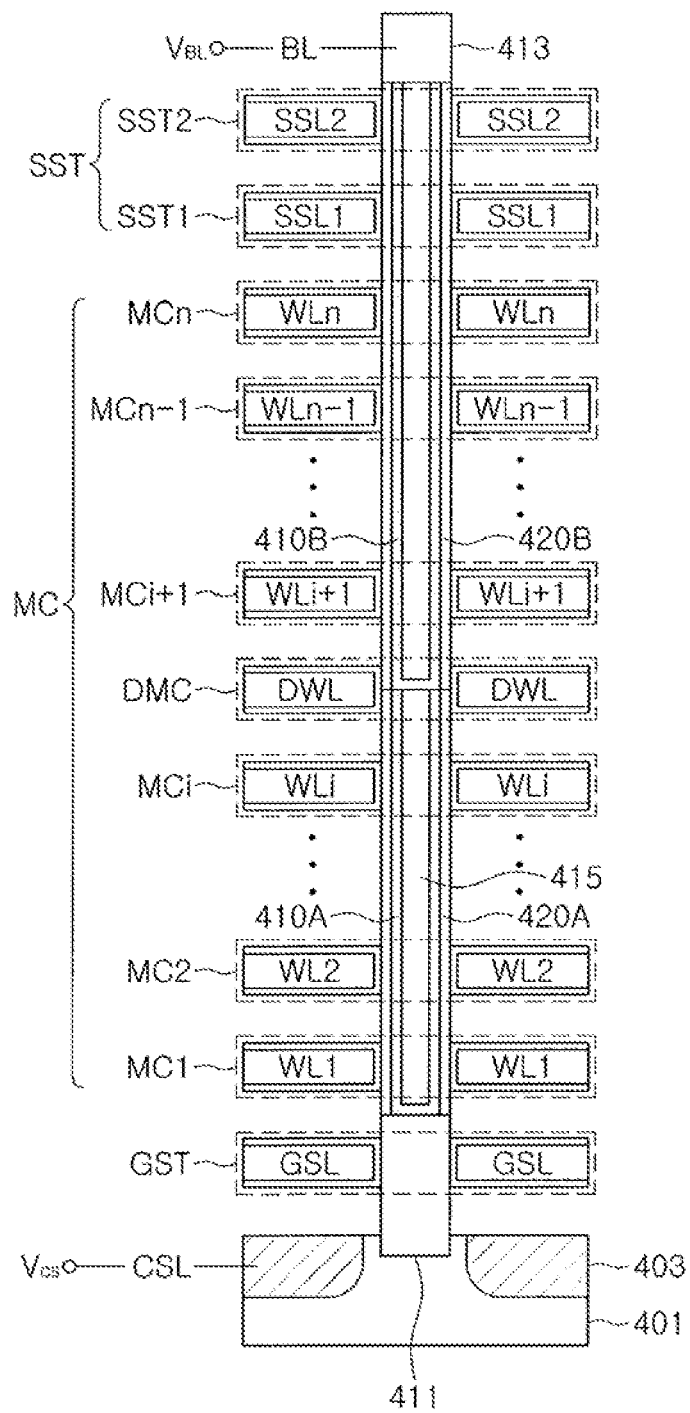
FIG. 12 illustrates a view of a memory device according to an example embodiment.

FIG. 12 is a view illustrating a memory device according to an example embodiment. FIG. 12 is a view of a single memory cell string from the memory device 400 illustrated in FIG. 11.

Referring to FIG. 12, a memory device according to an example embodiment may include a plurality of word lines WL1 to WLn stacked on one another, e.g., along the z-axis direction, and adjacent to a channel region 210, string select lines SSL1 and SSL2 adjacent the word line WLn, and a ground select line GSL adjacent the word line WL1, and the like. In an example embodiment, the ground select line GSL may be adjacent to an epitaxial layer 411, instead of the channel region 410. Thus, a ground select transistor GST may have a different structure from those of string select transistors SST1 and SST2 (string select transistor SST) and memory cells MC1 to MCn (memory cells MC). A dummy word line DWL may be between at least portions of the plurality of word lines WL1 to WLn, and the dummy word line DWL may provide a dummy memory cell DMC.

The memory cells MC may be connected to each other in series between the string select transistor SST and the ground select transistor GST. In the example embodiment illustrated in FIG. 12, n memory cells MC and a single dummy memory cell DMC are illustrated as being connected to each other between the string select transistor SST and the ground select transistor GST, and the number of memory cells MC and dummy memory cells DMC may be variously modified.

A drain region 413 may be formed of a conductive material, and may be on the channel region 410, and a source region 403 doped with an impurity may be formed in the substrate 401. The drain region 413 and the source region 403 may be connected to a bit line BL and a common source line CSL, respectively. A gate insulating layer 420 including a charge storage layer may be provided between the channel region 410 and the plurality of word lines WL1 to WLn. In an example, in the memory cells MC adjacent to the substrate 401, the gate insulating layer 420 may have a relatively thin thickness, e.g., thinner than the gate insulating layer 420 neat the drain region 413, due to an error in a process.

Figure 13:
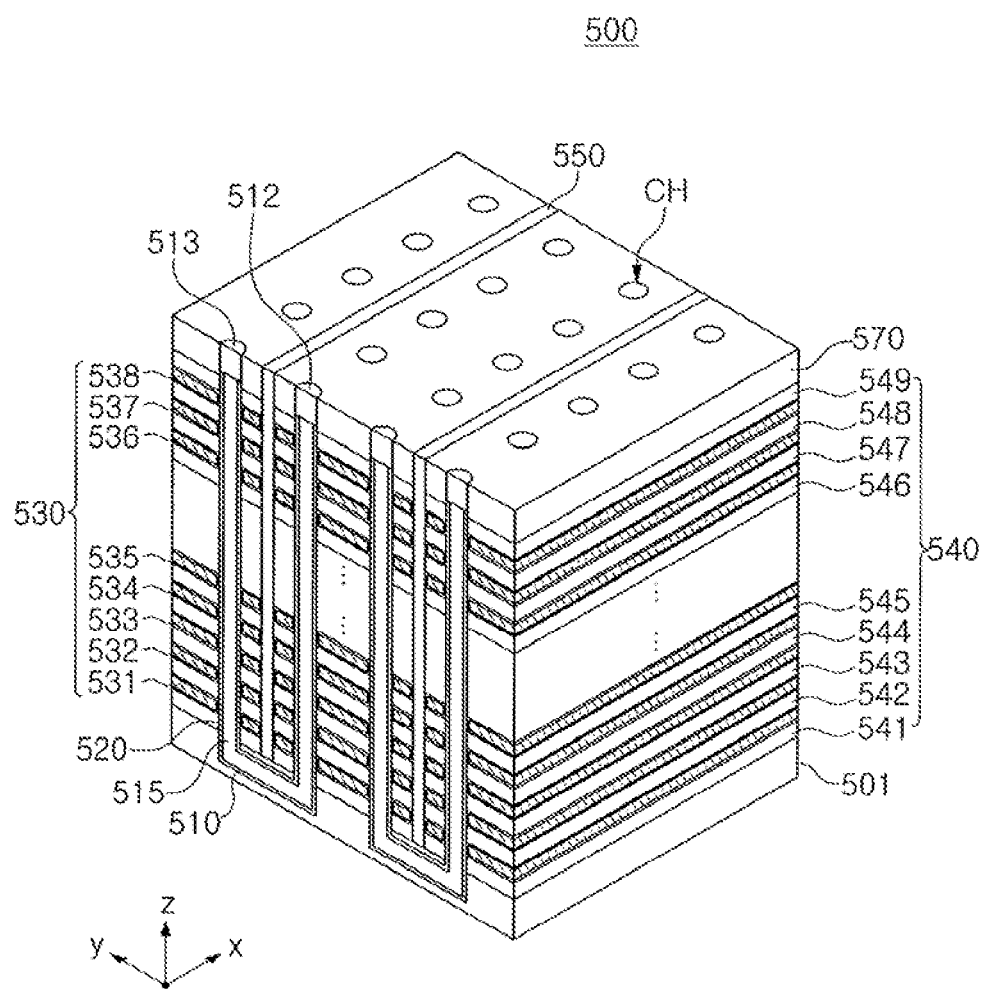
FIG. 13 illustrates a schematic view of a structure of a memory device according to an example embodiment.

FIG. 13 is a schematic view of a structure of a memory device according to an example embodiment. FIG. 13 is a partial perspective view of a memory cell array included in a memory device 500.

In the case of the memory device 500 according to an example embodiment illustrated in FIG. 13, a source region may not be formed within a substrate 501. A channel region 510 may have a bent U-shape, and a source region of a ground select transistor and a drain region of a string select transistor may be provided by conductive layers 512 and 513 formed on both ends of the channel region 510, respectively.

Referring to FIG. 13, a plurality of gate electrode layers 531 to 538 (gate electrode layers 530) and a plurality of insulating layers 541 to 549 (insulating layers 540) may be alternately stacked, e.g., along the z-axis direction, and an inside of the channel region 510 may be filled with an embedded insulating layer 515. An interlayer insulating layer 570 may further be formed on the plurality of gate electrode layers 530. A gate insulating layer 520 may be formed between the gate electrode layers 530 and the channel region 510. At least one of a plurality of layers included in the gate insulating layer 520 may also be formed along an external side of the channel region 510.

The gate electrode layers 530 may be divided into a plurality of portions by an isolation insulating layer 550. In an example embodiment, the isolation insulating layer 550 may be provided in a U-shape of the channel region 510 bent in the U-shape. Thus, the memory device 500 may be implemented in such a manner that a single channel region 510 bent in a U-shape is adjacent to the gate electrode layers 530, divided into a plurality of portions.

Figure 14:
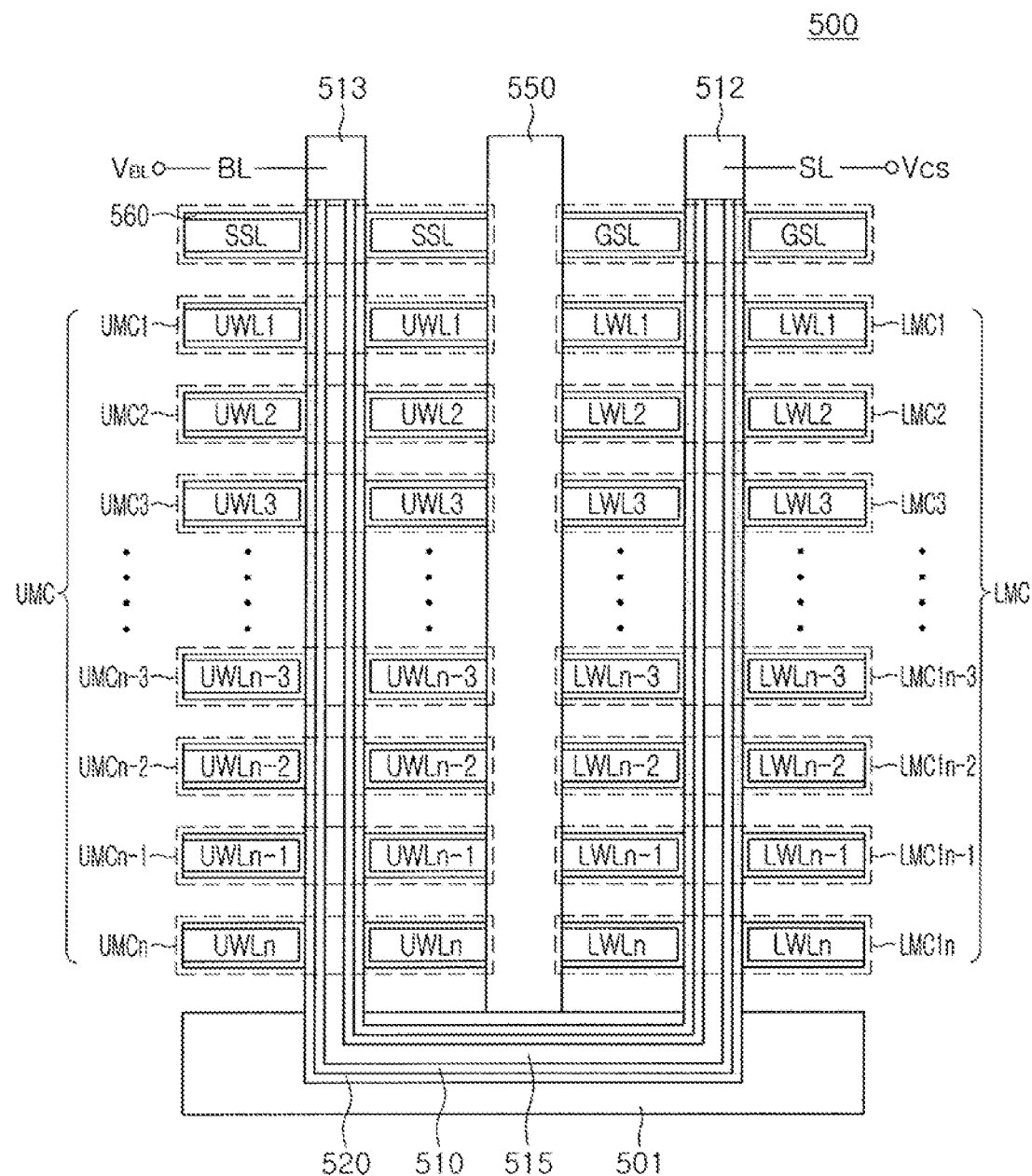
FIG. 14 illustrates a view of a memory device according to an example embodiment.

FIG. 14 is a view illustrating a memory device according to an example embodiment. FIG. 14 is a view of a single memory cell string from the memory device 400 illustrated in FIG. 13.

Referring to FIG. 14, the gate electrode layers may be divided into a plurality of regions by the isolation insulating layer 550, to provide a plurality of word lines UWL and DWL. In an example embodiment, upper word lines UWL1-UWLn (UWL) may be provided between a string select line SSL and the substrate 501, and lower word lines LWL1 to LWLn (LWL) may be provided between a ground select line GSL and the substrate 501.

The upper word lines UWL and the lower word lines LWL are separated from each other by the isolation insulating layer 550, and thus, may provide different memory cells. The upper word lines UWL may provide upper memory cells DMC1 to UMCn (UMC), and the lower word lines LWL may provide lower memory cells LMC1 to LMCn (LMC). The channel region 510 may be cylindrical and may be bent in a U-shape, and the gate insulating layer 520 may be provided along the external side of the channel region 510. For example, the channel regions 510 may extend in the substrate 501 along the x-axis and y-axis directions.

The memory devices 400 and 500, described above with reference to FIGS. 11 to 14, may be configured to select a program memory cell in which data is to be stored, from among the memory cells MC, and to sequentially perform a first programming operation and a second programming operation on the program memory cell, thereby storing data. In an example embodiment, a program voltage input to the program memory cell by the memory device 400 may vary based on information regarding the respective memory cells MC that may affect threshold voltage distributions of the memory cells MC. In an example embodiment, the information regarding the respective memory cells MC may include information specifying physical positions of the respective memory cells MC, e.g., a location of word lines, a location of the channel region, a distance to a common source line, and the like.

For example, in the example embodiment illustrated in FIGS. 11 and 12, a program voltage input to a program memory cell may vary depending on whether the program memory cell selected from among the memory cells MC is adjacent to a lower channel region 410A or to an upper channel region 410B. For example, in the example embodiment illustrated in FIGS. 13 and 14, a program voltage input to a program memory cell may vary depending on whether the program memory cell is included in the upper memory cells UMC or the lower memory cells LMC, which will be described together with reference to FIGS. 15A, 15B, 16A, and 16B.

FIGS. 15A, 15B, 16A, and 16B are diagrams illustrating threshold voltage distributions of memory cells included in a memory device according to an example embodiment.

Figure 15A:
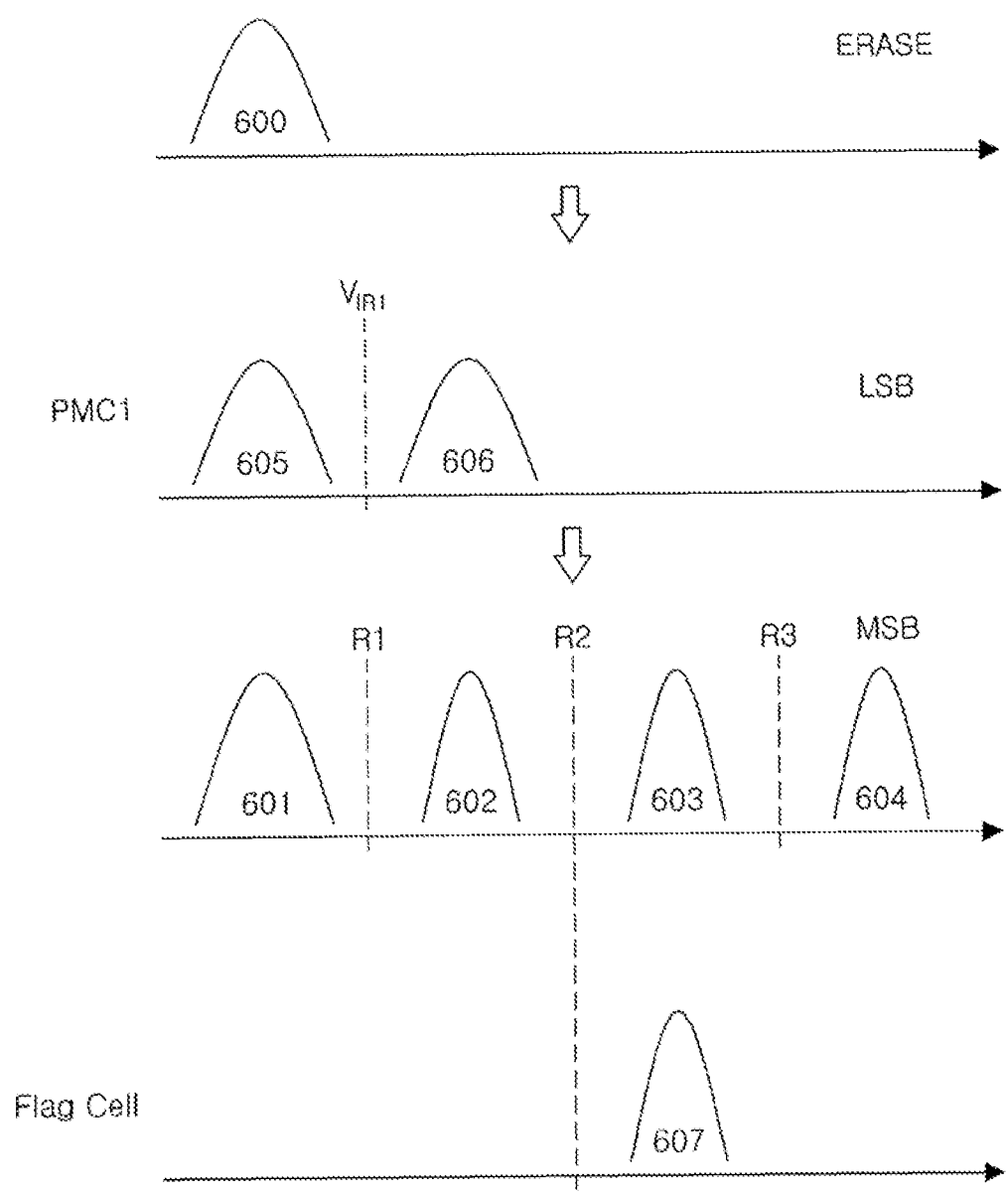
FIGS. 15A, 15B, 16A and 16B illustrate diagrams of threshold voltage distributions of memory cells included in a memory device according to an example embodiment.
Figure 15B:
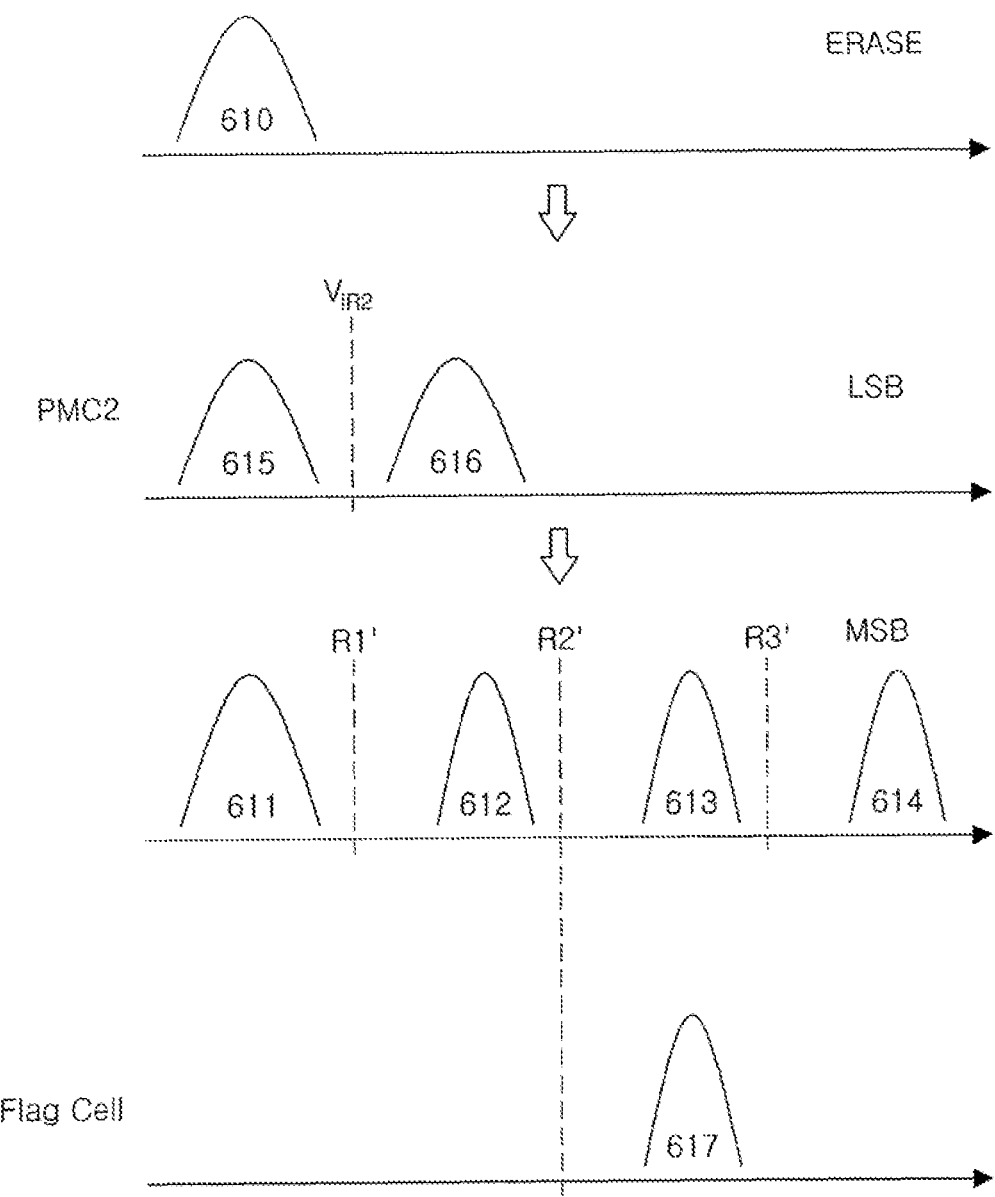

In the case of a programming method according to an example embodiment illustrated in FIGS. 15A and 15B, in an MLC mode in which two or more bits of data are stored in a single memory cell, a lower bit LSB may be stored in a memory cell by a first programming operation, and an upper bit MSB may be stored in a memory cell by a second programming operation. FIGS. 15A and 15B are diagrams illustrating a programming method with respect to respective program memory cells located in different positions in the memory device.

First, referring to FIG. 15A, the first programming operation may be performed by inputting a first program voltage to a first program memory cell PMC1 in an erase state 600, and the second programming operation may be performed by inputting a second program voltage to the first program memory cell PMC1. The first programming operation and the second programming operation may be executed sequentially, and may be similar to the operations described above with reference to FIGS. 9A and 9B.

A threshold voltage of the first program memory cell PMC1 may be changed to either a first prestate 605 or a second prestate 606 by the first programming operation. The memory device may discriminate the lower bit LSB written to the first program memory cell PMC1 by inputting a first intermediate read voltage $V_{IR1}$ to the first program memory cell PMC1, and may perform the second programming operation of inputting the second program voltage to the first program memory cell PMC1. By the second programming operation, the state of the first program memory cell PMC1 may be changed from the first prestate 605 to a first state 601 or a second state 602, or may be changed from the second prestate 606 to a third state 603 or a fourth state 604. A flag cell may be a memory cell indicating the number of bits of data written to the first program memory cell PMC1. For example, when two bits are written in the first program memory cell PMC1, the flag cell may have state 607.

Subsequently, referring to FIG. 15B, the first programming operation and the second programming operation may be sequentially performed by sequentially inputting a first program voltage and a second program voltage to a second program memory cell PMC2 in an erase state 610. The second program memory cell PMC2 may be in a location different from that of the first program memory cell PMC1 and may have a threshold voltage distribution different therefrom. Thus, the first program voltage input to the second program memory cell PMC2 may be different from the first program voltage input to the first program memory cell PMC1.

Describing an example, referring to the example embodiment illustrated in FIG. 11, one of the first program memory cell PMC1 and the second program memory cell PMC2 may be a memory cell provided by the lower channel region 410A, and the other may be a memory cell provided by the upper channel region 410B. In the example embodiment illustrated in FIG. 13, one of the first program memory cell PMC1 and the second program memory cell PMC2 may be one of the upper memory cells UMC, and the other may be one of the lower memory cells LMC.

Since at least one of the first program voltage and the second program voltage input to the first program memory cell PMC1 and the second program memory cell PMC2, respectively, is different therefrom, first to fourth states 601 to 604 of the first program memory cell PMC1 may be different from first to fourth states 611 to 614 of the second program memory cell PMC2. Thus, first to third read voltages R1' to R3' used for program verification or a reading operation of the second program memory cell PGM Cell2 may also be different from first to third read voltages R1 to R3 of the first program memory cell PGM Cell1. A flag cell may be a memory cell indicating the number of bits of data written to the second program memory cell PMC2. For example, when two bits are written in the first program memory cell PMC1, the flag cell may have state 617.

Figure 16A:
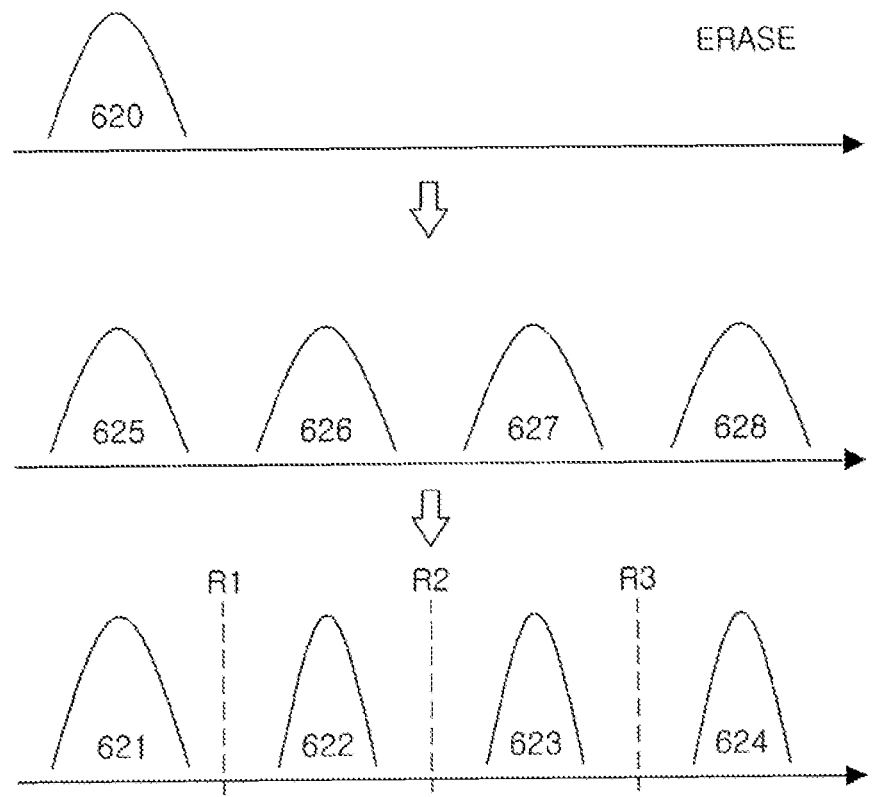
Figure 16B:
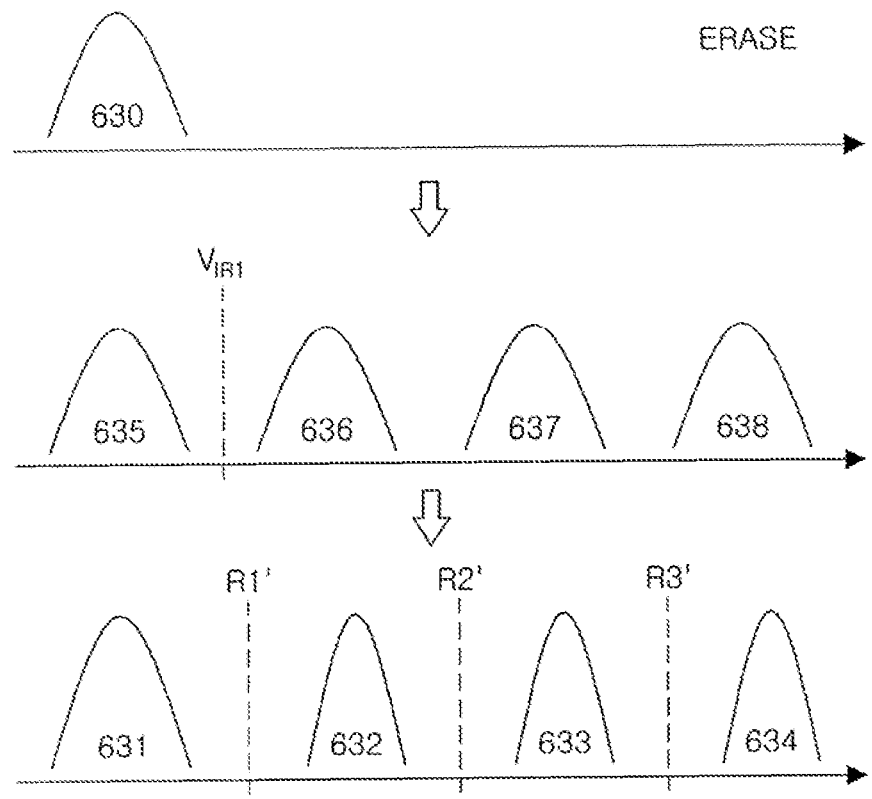

Then, in a programming method according to an example embodiment illustrated in FIGS. 16A and 16B, in an MLC mode in which two or more bits of data are stored in a single memory cell, two or more bits of data may be stored in a memory cell by sequentially performing a first programming operation and a second programming operation. In a manner different from the example embodiment of FIGS. 15A and 15B, the same number of bits of data may be stored in the memory cell by the first programming operation and the second programming operation. FIGS. 15A and 15B are diagrams illustrating a programming method with respect to first and second program memory cells PMC1 and PMC2 located in different positions in the memory device.

Referring to FIG. 16A, a first programming operation and a second programming operation may be sequentially executed on the first program memory cell PMC1 provided in an erase state 620. A threshold voltage of the first program memory cell PMC1 may be changed to one of first to fourth prestates 625 to 628 by the first programming operation. On the other hand, by the second programming operation, a state of the first program memory cell PMC1 may be changed to one of first to fourth states 621 to 624. The first to fourth states 621 to 624 may have a relatively narrow threshold voltage distribution, as compared with the first to fourth prestates 625 to 628, respectively. Thus, a relatively great margin may be secured in the threshold voltage distribution of the first program memory cell PMC1 by the second programming operation.

Then, referring to FIG. 16B, the first programming operation and the second programming operation may be sequentially executed on the second program memory cell PMC2 provided in an erase state 630. The second program memory cell PMC2 may be a memory cell having a threshold voltage distribution different from that of the first program memory cell PMC1. In an example embodiment, the first program voltage input to the second program memory cell PMC2 may be different from a first program voltage input to the first program memory cell PMC1.

Describing an example, referring to the example embodiment illustrated in FIG. 11, one of the first program memory cell PMC1 and the second program memory cell PMC2 may be a memory cell provided by the lower channel region 410A, and the other may be a memory cell provided by the upper channel region 410B. In the example embodiment illustrated in FIG. 13, one of the first program memory cell PMC1 and the second program memory cell PMC2 may be one of the upper memory cells UMC, and the other may be one of the lower memory cells LMC.

Since at least one of the first program voltage and the second program voltage input to the first program memory cell PMC1 and the second program memory cell PMC2, respectively, is different therefrom, first to fourth states 601 to 604 of the first program memory cell PMC1 may be different from first to fourth states 611 to 614 of the second program memory cell PMC2. Thus, first to third read voltages R1' to R3' used for a program verification or an reading operation of the program memory cell PGM Cell2 may also be different from first to third read voltages R1 to R3 of the first program memory cell PGM Cell1.

Figure 17:
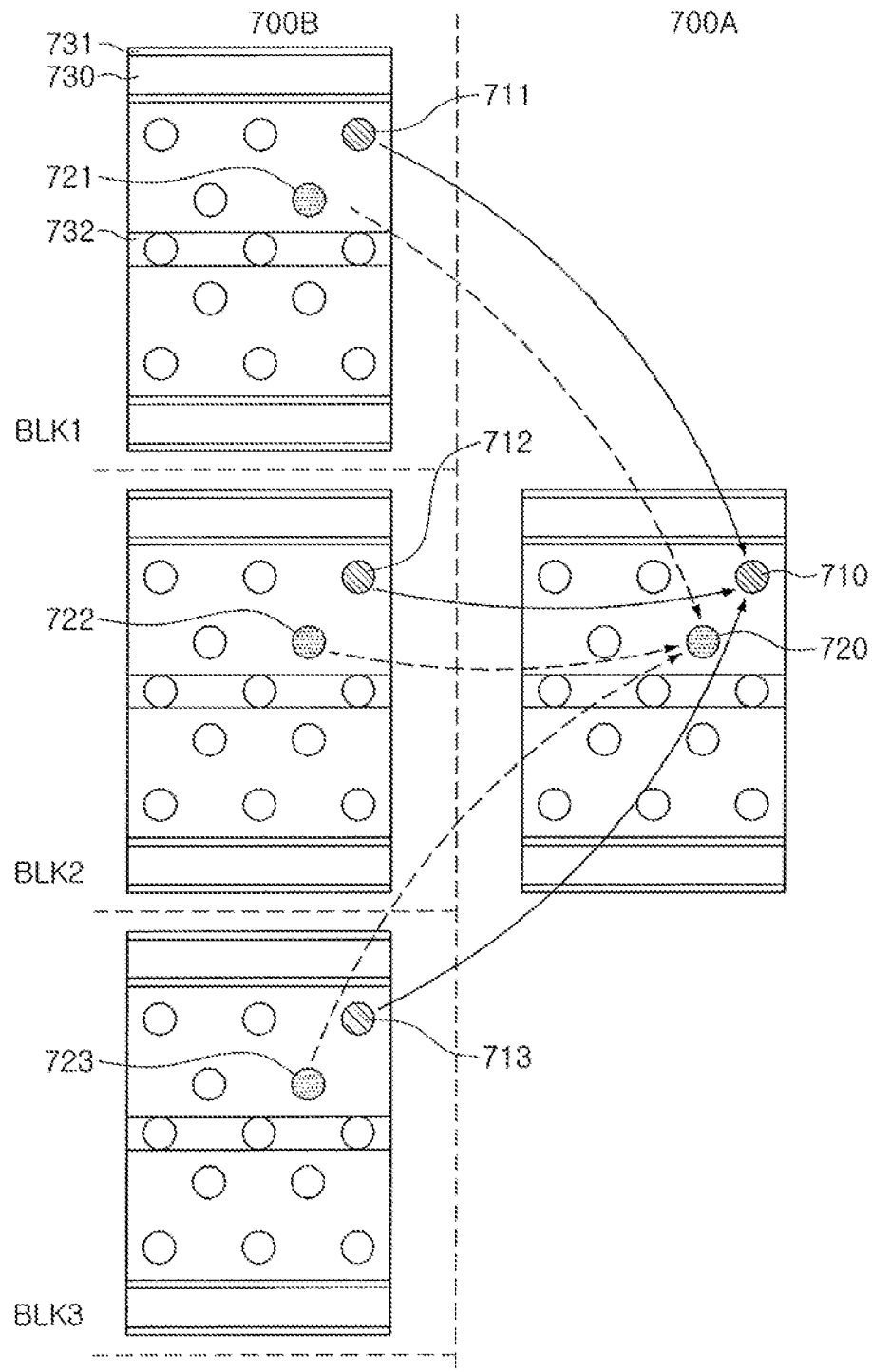
FIG. 17 illustrates a view of operations of a memory device according to an example embodiment.

FIG. 17 is a view illustrating operations of a memory device according to an example embodiment. Referring to FIG. 17, a memory device according to an example embodiment may include a first memory region 700A and a second memory region 700B. The first memory region 700A and the second memory region 700B may have the same structure. In an example, a plurality of word lines included in each of the first memory region 700A and the second memory region 700B may be divided into a plurality of regions by a common source line 730 and a spacer 731, and only string select lines may be divided into two regions by an isolation insulating layer 732, between the common source lines 730.

In an example embodiment, memory cells included in the first memory region 700A may respectively operate in an MLC mode to store N bits of data, where N is a natural number. Memory cells included in the second memory region 700B may operate in an SLC mode, to store one bit of data. The first memory region 700A may be a region in which general data is stored, and the second memory region 700B may be a region to provide an operation of an on-chip buffer program (OBP).

In an example embodiment, N bits of data may be stored in each of first program memory cells 710 and 720 of the first memory region 700A, and N bits of data may be divided for each bit, to be stored in N second program memory cells 711 to 713 and 721 to 723 of the second memory region 700B. In addition, positions of the N second program memory cells 711 to 713 and 721 to 723 in the second memory region 700B may correspond to positions of the first program memory cells 710 and 720 in the first memory region 700A.

In the example embodiment illustrated in FIG. 17, the memory cells of the first memory region 700A may store three bits of data, and the memory cells of the second memory region 700B may store data stored in the memory cells data of the first memory region 700A bit by bit. For example, 3 bits of program data, stored in the first program memory cell 710 of the first memory region 700A, may be divided for each bit, to be stored in the second program memory cells 711 to 713 included in first to third blocks BLK1 to BLK3, respectively. For example, a least significant bit of the program data may be stored in the second program memory cell 711 of the first block BLK1, an intermediate bit of the program data may be stored in the second program memory cell 712 of the second block BLK2, and a most significant bit of the program data may be stored in the second program memory cell 713 of the third block BLK3. Similarly, 3 bits of program data stored in the first program memory cell 720 of the first memory region 700A may be divided for each bit, to be stored in the second program memory cells 721 to 723, included in the first to third blocks BLK1 to BLK3 of the second memory region 700B, respectively.

The positions of the second program memory cells 711 to 713 and 721 to 723 may be the same as the positions of the first program memory cells 710 and 720. For example, when the first program memory cell 710 is provided by an i-th word line from a substrate, the second program memory cells 711 to 713 may also be selected as memory cells provided by the i-th word line from the substrate. As a position of a channel region is considered together with a position of the word line, the second program memory cells 711 to 713 and 721 to 723, corresponding to the positions of the first program memory cells 710 and 720, respectively, may be selected.

Figure 18A:
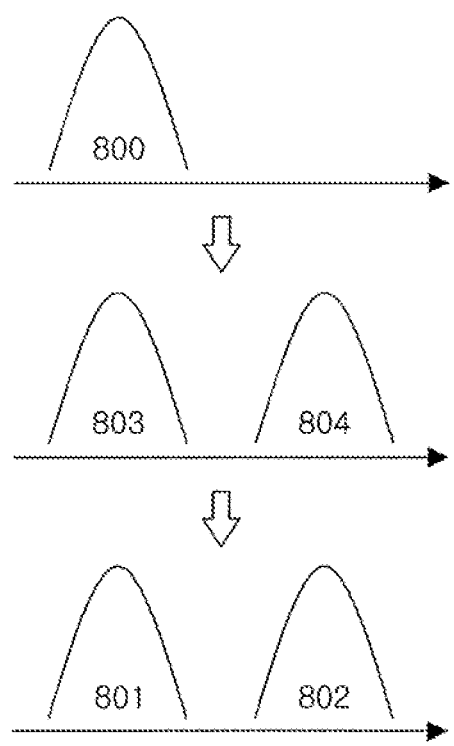
FIGS. 18A to 18C illustrate diagrams of threshold voltage distributions of memory cells included in a memory device according to an example embodiment.
Figure 18B:
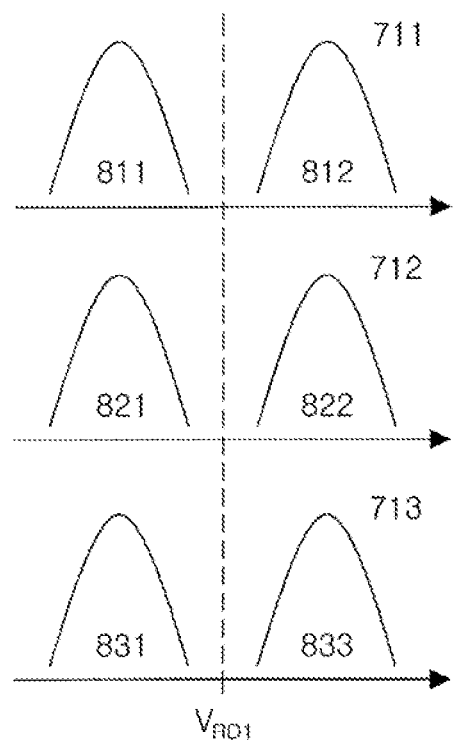
Figure 18C:
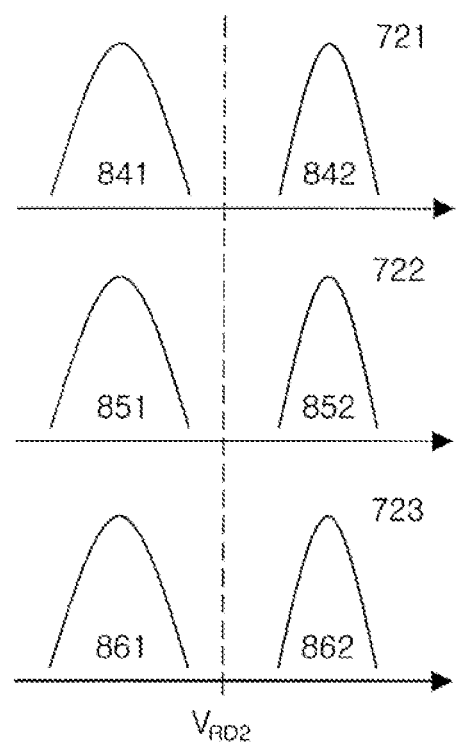

FIGS. 18A to 18C are diagrams illustrating threshold voltage distributions of memory cells included in a memory device according to an example embodiment.

FIG. 18A is a diagram illustrating programming operations of respective memory cells, included in the second memory region 700B. The memory cells included in the second memory region 700B may respectively operate in an SLC mode. Referring to FIG. 18A, a first programming operation may be performed on memory cells provided in an erase state 800, to change threshold voltage distributions of memory cells to a first prestate 803 and a second prestate 804. The memory device may change the threshold voltage distributions of the memory cells to a first state 801 and a second state 802, by executing a second programming operation after the first programming operation. The first state 801 and the second state 802 may have a relatively narrow threshold voltage distribution, as compared with those of the first prestate 803 and the second prestate 804, and, thus, may have a relatively great voltage margin.

FIGS. 18B and 18C are diagrams illustrating threshold voltage distributions, based on information regarding memory cells included in the second memory region 700B. The information of the memory cells may include information indicating physical locations of the memory cells in each of the first to third blocks BLK1 to BLK3 included in the second memory region 700B. Threshold voltage distribution characteristics may vary depending on the physical locations of the memory cells. In an example embodiment, different program voltages may be applied thereto, considering different threshold voltage distribution characteristics of memory cells.

Referring to FIG. 18B, the threshold voltage distributions of the respective second program memory cells 711 to 713 described above with reference to FIG. 17 are illustrated. Further, referring to FIG. 18C, the threshold voltage distributions of the respective second program memory cells 721 to 723 described above with reference to FIG. 17 are illustrated. As illustrated in FIGS. 18B and 18C, the second program memory cells 711 to 713 and 721 to 723 may have different threshold voltage distribution characteristics depending on positions of the second program memory cells. In an example embodiment, considering the locations of the second program memory cells 711 to 713 and 721 to 723, which may affect the threshold voltage distribution characteristics, different program voltages may be applied to the second program memory cells 711 to 713 and 721 to 723. Thus, as illustrated in FIGS. 18B and 18C, the threshold voltage distributions of the second program memory cells 711 to 713 and 721 to 723 may be different from each other, and a sufficient voltage margin may be secured.

In particular, as may be seen in FIG. 18B, the second program memory cell 711 may have a first state 811 and a second state 812, the second program memory cell 712 may have a first state 821 and a second state 822, and the second program memory cell 713 may have a first state 831 and a second state 833. As may be seen in FIG. 18C, the second program memory cell 721 may have a first state 841 and a second state 842, the second program memory cell 722 may have a first state 851 and a second state 852, and the second program memory cell 723 may have a first state 861 and a second state 862.

When data stored in the first memory region 700A is restored or corrected by referring to data stored by respective bits in the second memory region 700B, different read voltages $V_{RD1}$ and $V_{RD2}$ may be applied thereto, depending on information regarding the second program memory cells 711 to 713 and 721 to 723. As described above, different program voltages may be applied depending on positions of the second program memory cells 711 to 713 and 721 to 723, and thus, distributions of the second program memory cells 711 to 713 and 721 to 723 may vary. Thus, the read voltages $V_{RD1}$ and $V_{RD2}$ used to read data stored in the second program memory cells 711 to 713 and 721 to 723 may also be determined differently from each other, depending on the positions of the second program memory cells 711 to 713 and 721 to 723.

Figure 19:
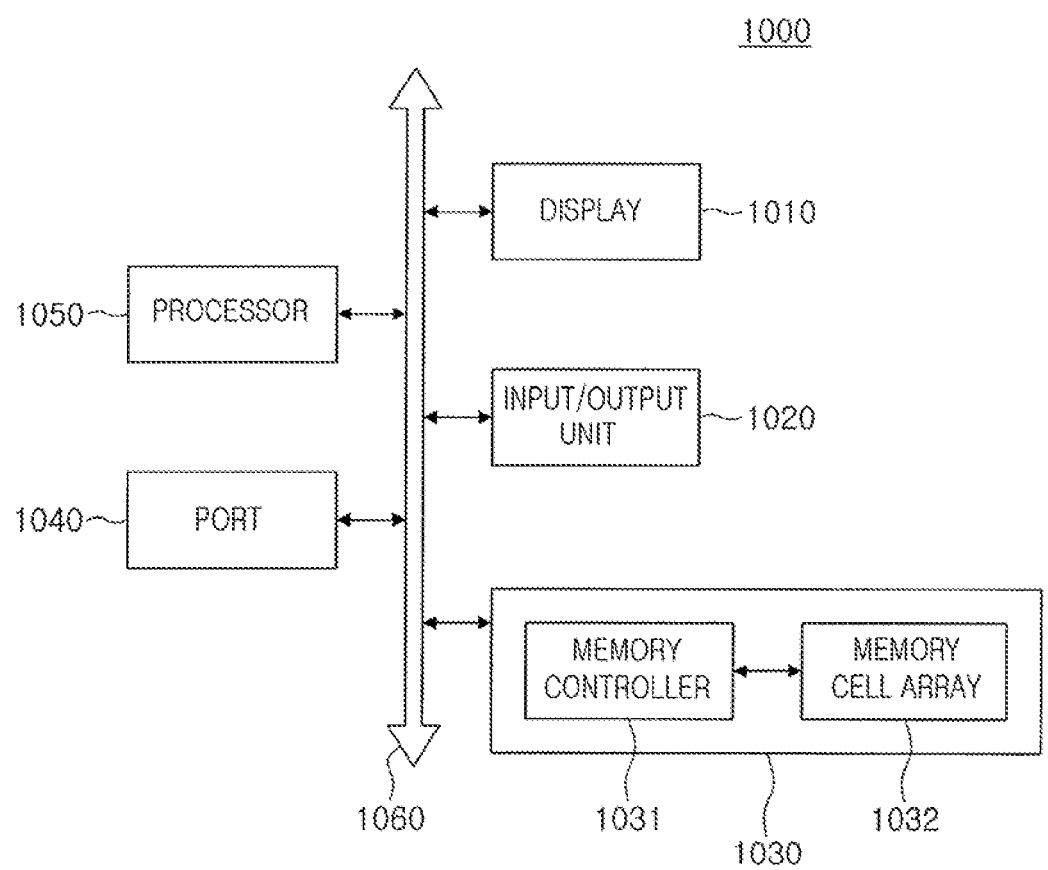
FIG. 19 illustrates a block diagram of an electronic device including a memory device according to an example embodiment.

FIG. 19 is a schematic block diagram of an electronic device including a memory device according to an example embodiment. Referring to FIG. 19, an electronic device 1000 according to an example embodiment may include a display 1010, an input/output unit 1020, a memory 1030, a port 1040, a processor 1050, and the like. Examples of the electronic device 1000 may include a television set, a desktop computer, and the like, as well as a mobile device such as a smartphone, a tablet PC, a laptop computer and the like. Components, such as the display 1010, the input/output unit 1020, the memory 1030, the port 1040, the processor 1050 and the like, may communicate with each other via a bus 1060.

The memory 1030 may include a memory controller 1031 and a memory cell array 1032, and may receive a command transmitted by the processor 1050 via the bus 1060, to perform operations such as programming, reading, erasing operations, and the like. An example of the memory 1030 may include a NAND-type flash memory device, and may include any one of the memory devices according to various example embodiments described above with reference to FIGS. 1 to 18.

The controllers and other processing features of the embodiments described herein may be implemented in logic, which, for example, may include hardware, software, or both. When implemented at least partially in hardware, the controllers and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

As set forth above, according to an example embodiment, a first programming operation and a second programming operation may be sequentially performed, to store data in a program memory cell in which data is to be stored, and a program voltage input to the program memory cell may be adjusted in the first programming operation, based on information indicating program memory cell characteristics. Thus, degradation of a threshold voltage distribution due to interference between memory cells may be prevented, and operation characteristics and reliability of a memory device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
a plurality of word lines stacked on a substrate and connected to a plurality of memory cells;
a plurality of bit lines connected to a plurality of channel structures penetrating through the plurality of word lines;
at least one ground select line disposed adjacent to the substrate;
at least one string select line disposed adjacent to the plurality of bit lines; and
a row driver configured to select at least one program memory cell to be programmed and at least one flag cell that stores a number of bits of data programmed in the program memory cell,
wherein the row driver inputs a first program voltage having a first magnitude to a first program memory cell to write a lower bit of first N bits of data to the first program memory cell when a distance between the first program memory cell and the substrate is a first distance, and inputs a second program voltage having a second magnitude greater than the first magnitude to a second program memory cell to write a lower bit of second N bits of data to the second program memory cell when a distance between the second program memory cell and the substrate is a second distance lesser than the first distance.

2. The memory device of claim 1, wherein the flag cell is programmed as a single-level cell.

3. The memory device of claim 1, wherein the row driver determines a read voltage input to the flag cell, in a reading operation of the flag cell, based on the number of bits of data programmed in the program memory cell corresponding to the flag cell.

4. The memory device of claim 1, wherein each of the plurality of channel structures includes a lower channel region extending from the substrate, and an upper channel region extending between the lower channel region and at least one of the plurality of bit lines.

5. The memory device of claim 4, the plurality of word lines comprises at least one dummy word line disposed adjacent to a boundary between the lower channel region and the upper channel region.

6. The memory device of claim 1, wherein the row driver inputs a program voltage having a magnitude different from the first magnitude, to write an upper bit of the first N bits of data to the first program memory cell.

7. A memory device, comprising:
a plurality of word lines stacked on a substrate and connected to a plurality of memory cells;
a plurality of bit lines connected to a plurality of channel structures penetrating through the plurality of word lines;
at least one ground select line disposed adjacent to the substrate;
at least one string select line disposed adjacent to the plurality of bit lines; and
a row driver configured to select at least one program memory cell to be programmed and at least one flag cell that stores a number of bits of data programmed in the program memory cell,
wherein the row driver inputs a third program voltage having a third magnitude to a first flag cell when a distance between the first flag cell and the substrate is a third distance, and inputs a fourth program voltage having a fourth magnitude greater than the third magnitude to a second flag cell when a distance between the second flag cell and the substrate is a fourth distance lesser than the third distance.

8. The memory device of claim 7, wherein the at least one program memory cell stores N bits of data, and N is an integer equal to or more than 2, and
the row driver inputs a lower bit program voltage to write a lower bit of N bits of data to the at least one program memory cell, and inputs an upper bit program voltage having a magnitude different from a magnitude of the lower bit program voltage to write an upper bit of N bits of data to the at least one program memory cell.

9. The memory device of claim 7, wherein the at least one program memory cell stores N bits of data, and N is an integer equal to or more than 2, and
the read voltage input to the flag cell is determined based on the number of bits of data stored in the program memory cell corresponding to the flag cell.

10. A memory device, comprising:
a plurality of word lines stacked on a substrate and connected to a plurality of memory cells;
a plurality of bit lines connected to a plurality of channel structures penetrating through the plurality of word lines;
at least one ground select line disposed adjacent to the substrate;
at least one string select line disposed adjacent to the plurality of bit lines; and
a row driver configured to input a first read voltage having a first magnitude to a first program memory cell when a distance between the first program memory cell and the substrate is a first distance, and input a second read voltage having a second magnitude greater than the first magnitude to a second program memory cell when a distance between the second program memory cell and the substrate is a second distance lesser than the first distance.

11. The memory device of claim 10, wherein the row driver inputs a first program voltage to write first N bits of data to the first program memory cell, and inputs a second program voltage to write second N bits of data to the second program memory cell, and
the first program voltage has a different magnitude from the second program voltage.

12. The memory device of claim 11, wherein when the first N bits of data is equal to the second N bits of data, a threshold voltage of the first program memory cell is lesser than a threshold voltage of the second program memory cell.

* * * * *